US012777725B2

(12) United States Patent
Lv et al.

(10) Patent No.: US 12,777,725 B2
(45) Date of Patent: Oct. 27, 2026

(54) DIODE WITH INTRINSIC EPITAXIAL LAYER

(71) Applicant: Texas Instruments Incorporated, Dallas, TX (US)

(72) Inventors: Tian Ping Lv, Yibin (CN); Yuanchun Wu, Sichuan (CN); Sunglyong Kim, Allen, TX (US); Kartikey Thakar, Bangalore (IN); Cheng Yuan Xu, Chengdu (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 349 days.

(21) Appl. No.: 18/397,811

(22) Filed: Dec. 27, 2023

(65) Prior Publication Data

US 2025/0221052 A1 Jul. 3, 2025

(51) Int. Cl.

| | |
|---|---|
| ***H10D 89/60*** | (2025.01) |
| ***H10D 8/01*** | (2025.01) |
| ***H10D 8/25*** | (2025.01) |
| ***H10P 14/20*** | (2026.01) |
| ***H10P 30/20*** | (2026.01) |

(Continued)

(52) U.S. Cl.
CPC ........... *H10D 89/611* (2025.01); *H10D 8/022* (2025.01); *H10D 8/25* (2025.01); *H10P 14/20* (2026.01); *H10P 30/202* (2026.01); *H10P 70/20* (2026.01); *H10W 10/014* (2026.01); *H10W 10/17* (2026.01)

(58) Field of Classification Search
CPC ........ H10D 89/611; H10D 8/00; H10D 8/022; H10D 8/25; H10P 14/20; H10P 30/202; H10P 70/20; H10P 30/21; H10P 30/22; H10W 10/014; H10W 10/17
See application file for complete search history.

(56) References Cited

U.S. PATENT DOCUMENTS 5,239,440 A 8/1993 Merrill
6,624,992 B1 9/2003 Aparin
(Continued)

OTHER PUBLICATIONS

Richard Merrill and Enayet Issaq, "ESD Design Methodology", 1993 EOS/ESD Symposium, pp. 5b.5.1-5b.5.5, 1993.
(Continued)

*Primary Examiner* — Wasiul Haider
(74) *Attorney, Agent, or Firm* — Yudong Kim; Charles F. Koch

(57) ABSTRACT

An electronic device includes an n-type substrate having a first concentration of n-type dopants, an intrinsic epitaxial layer on the n-type substrate having a second concentration of n-type dopants that is less than the first concentration of n-type dopants, an n-type epitaxial layer on the intrinsic epitaxial layer having a third concentration of n-type dopants that is greater than the second concentration of n-type dopants, and a p-type epitaxial layer on the n-type epitaxial layer. A method includes growing an intrinsic epitaxial layer having a second concentration of n-type dopants on an n-type substrate having a higher first concentration of n-type dopants, growing an n-type epitaxial layer having a third concentration of n-type dopants on the intrinsic epitaxial layer, the third concentration of n-type dopants being greater than the second concentration of n-type dopants, and growing a p-type epitaxial layer on the n-type epitaxial layer.

14 Claims, 20 Drawing Sheets

(51) Int. Cl.

| | |
|---|---|
| ***H10P 70/00*** | (2026.01) |
| ***H10W 10/00*** | (2026.01) |
| ***H10W 10/17*** | (2026.01) |

(56) References Cited

U.S. PATENT DOCUMENTS

| | | | | |
|---|---|---|---|---|
| 7,286,331 | B2 | 10/2007 | Choi | |
| 7,821,752 | B2 | 10/2010 | Choi | |
| 8,093,623 | B2 | 1/2012 | Mawatari et al. | |
| 8,497,526 | B2 | 7/2013 | Vashchenko et al. | |
| 8,865,541 | B2 | 10/2014 | Farbiz et al. | |
| 9,006,833 | B2 | 4/2015 | Edwards et al. | |
| 9,153,569 | B1 | 10/2015 | Edwards et al. | |
| 9,224,724 | B2 | 12/2015 | Salman et al. | |
| 9,633,991 | B2 | 4/2017 | Salman et al. | |
| 2007/0045656 | A1 | 3/2007 | Chen | |
| 2009/0032838 | A1 | 2/2009 | Tseng et al. | |
| 2012/0091501 | A1 | 4/2012 | Vashchenko et al. | |
| 2012/0091504 | A1 | 4/2012 | Davis et al. | |
| 2012/0161232 | A1 | 6/2012 | Farbiz et al. | |
| 2013/0264640 | A1 | 10/2013 | Salman et al. | |
| 2013/0285113 | A1 | 10/2013 | Edwards et al. | |
| 2013/0320396 | A1 | 12/2013 | Salman et al. | |
| 2014/0124828 | A1 | 5/2014 | Salman et al. | |
| 2014/0308787 | A1 | 10/2014 | Kocon | |
| 2015/0085409 | A1 | 3/2015 | Ali et al. | |
| 2015/0146330 | A1 | 5/2015 | Appaswamy et al. | |
| 2015/0187752 | A1 | 7/2015 | Salman et al. | |
| 2015/0270253 | A1 | 9/2015 | Farbiz et al. | |
| 2015/0270256 | A1 | 9/2015 | Edwards et al. | |
| 2015/0270257 | A1 | 9/2015 | Edwards et al. | |
| 2015/0270708 | A1 | 9/2015 | Edwards et al. | |
| 2015/0294967 | A1 | 10/2015 | Salman et al. | |
| 2015/0340357 | A1 | 11/2015 | Edwards et al. | |
| 2015/0340358 | A1 | 11/2015 | Edwards et al. | |
| 2015/0371985 | A1 | 12/2015 | Edwards et al. | |
| 2016/0079227 | A1 | 3/2016 | Edwards et al. | |
| 2016/0079750 | A1 | 3/2016 | Edwards et al. | |
| 2016/0156176 | A1 | 6/2016 | Kunz, Jr. et al. | |
| 2016/0224716 | A1 | 8/2016 | Fabriz et al. | |
| 2016/0233668 | A1 | 8/2016 | Dia et al. | |
| 2016/0300831 | A1 | 10/2016 | Salman et al. | |
| 2017/0084601 | A1* | 3/2017 | Yao | H10D 62/114 |
| 2017/0098643 | A1 | 4/2017 | Xiu et al. | |
| 2018/0006013 | A1* | 1/2018 | Lin | H10D 62/115 |

OTHER PUBLICATIONS

Gao, Xiaofang, et al. "An improved electrostatic discharge protection structure for reducing triggering voltage and parasitic capacitance." Solid-State Electronics 47.6 (2003): 1105-1110.

Torres, Cynthia A., et al. "Modular, portable, and easily simulated ESD protection networks for advanced CMOS technologies." Microelectronics Reliability 42.6 (2002): 873-885.

Ker, Ming-Don, Hun-Hsien Chang, and Chung-Yu Wu. "A gate-coupled PTLSCR/NTLSCR ESD protection circuit for deep-submicron low-voltage CMOS ICs." Solid-State Circuits, IEEE Journal of 32.1 (1997): 38-51.

M. Stockinger et al. "Boosted and Distributed Rail Clamp Networks for ESD Protection in Advanced CMOS Technologies," EOS/ESD Symp. Proc., 2003, 10 pages.

M. Ker et al. "How to safely apply the LVTSCR for CMOS whole-chip ESD protection without being accidentally triggered on," Journal of Electrostatics 47 (1999), pp. 215-248.

Charvaka Duvvury and Carlos Diaz, "Dynamic Gate Coupling of NMOS for Efficient Output ESD Protection", Texas Instruments Incorporated, University of Illinois, IEEE/IRPS, 1992, pp. 141-150.

* cited by examiner

DIODE WITH INTRINSIC EPITAXIAL LAYER

BACKGROUND

Electrostatic discharge (ESD) protection circuits allow normal operation of a protected circuit with the capability to provide protection by conducting high currents in response to an ESD event. Vertical diodes can be used in an integrated bipolar structure of epitaxial layers for low capacitance reverse biasing during normal circuit operation and snap back for protection against ESD events. However, out-diffusion of substrate dopants into an epitaxial layer can increase the epitaxial layer dopant concentration, which changes the breakdown voltage rating of the ESD protection circuit. Rotation or spinning of the wafer during epitaxial layer formation can cause the the epitaxial layer concentration increase due to the substrate dopant out-diffusion to be more pronounced at the wafer edges than at the center. The diode p-n junction breakdown voltage rating of the ESD protection circuit is affected by the junction depletion layer width and the epitaxial layer dopant concentration. The within-wafer spatial variation in the epitaxial layer dopant concentration can reduce production yield with die areas near the wafer edge having worse breakdown voltage performance than die areas near the wafer center.

SUMMARY

In one aspect, an electronic device includes an n-type substrate having a first concentration of n-type dopants, an intrinsic epitaxial layer on the n-type substrate having a second concentration of n-type dopants that is less than the first concentration of n-type dopants, an n-type epitaxial layer on the intrinsic epitaxial layer having a third concentration of n-type dopants that is greater than the second concentration of n-type dopants, and a p-type epitaxial layer over the n-type epitaxial layer.

In another aspect, an electronic device includes a protected circuit coupled to a terminal and an electrostatic discharge protection circuit coupled to the terminal, where the protection circuit includes first and second stacks. The first stack includes a first portion of an n-type substrate, a first portion of an intrinsic epitaxial layer on the first portion of the n-type substrate, a first portion of an n-type epitaxial layer on the first portion of the intrinsic epitaxial layer, a first portion of a p-type epitaxial layer over the first portion of the n-type epitaxial layer, an n-type region in a portion of the first portion of the p-type epitaxial layer and spaced apart from the first portion of the n-type epitaxial layer to form a cathode of a first diode, and a p-type region in a portion of the n-type epitaxial layer and spaced apart from the n-type substrate, an interface between the p-type region and a portion of the n-type epitaxial layer forming a p-n junction of a Zener diode. The second stack is spaced apart from the first stack and includes a second portion of the n-type substrate, a second portion of the intrinsic epitaxial layer on the second portion of the n-type substrate, a second portion of the n-type epitaxial layer on the second portion of the intrinsic epitaxial layer, a second portion of the p-type epitaxial layer on the second portion of the n-type epitaxial layer, and the p-type region in the second portion of the p-type epitaxial layer and spaced apart from the second portion of the n-type epitaxial layer, an interface between the second portion of the p-type epitaxial layer and the second portion of the n-type epitaxial layer forming a p-n junction of a second diode.

In a further aspect, a method includes: growing an intrinsic epitaxial layer having a second concentration of n-type dopants on an n-type substrate of a wafer, the n-type substrate having a first concentration of n-type dopants greater than the second concentration of n-type dopants; growing an n-type epitaxial layer having a third concentration of n-type dopants on the intrinsic epitaxial layer, the third concentration of n-type dopants being greater than the second concentration of n-type dopants; and growing a p-type epitaxial layer on the n-type epitaxial layer.

DETAILED DESCRIPTION

Figure 1:
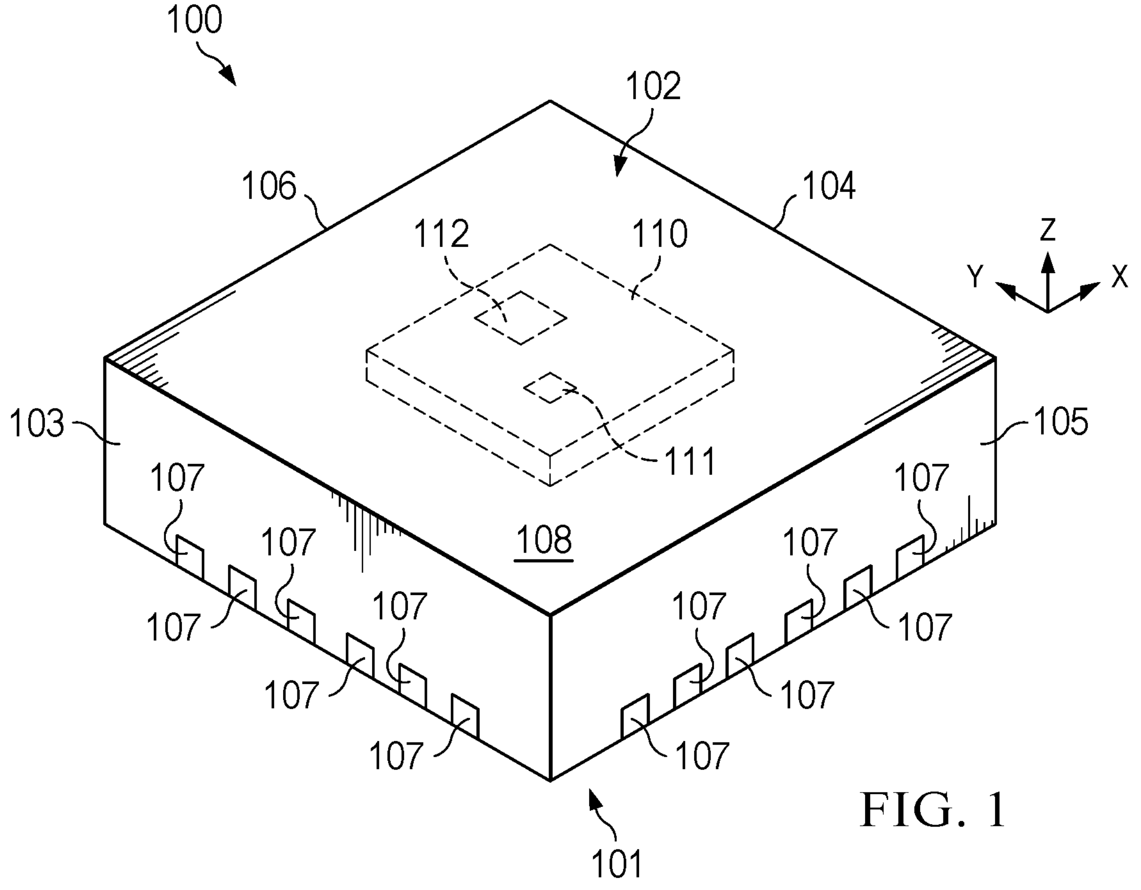
FIG. 1 is a top perspective view of an electronic device with a semiconductor die with an ESD protection circuit.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating. In the following discussion and in the claims, the terms "including", "includes", "having", "has", "with", or variants thereof are intended to be inclusive in a manner similar to the term "comprising", and thus should be interpreted to mean "including, but not limited to".

Unless otherwise stated, "about," "approximately," or "substantially" preceding a value means+/−10 percent of the stated value. One or more operational characteristics of various circuits, systems and/or components are hereinafter described in the context of functions which in some cases result from configuration and/or interconnection of various structures when circuitry is powered and operating. One or more structures, features, aspects, components, etc., may be referred to herein as first, second, third, etc., such as first and second terminals, first, second, and third, wells, etc., for ease of description in connection with a particular drawing, where such are not to be construed as limiting with respect to the claims. Various disclosed structures and methods of the present disclosure may be beneficially applied to manufacturing an electronic device such as an integrated circuit. While such examples may be expected to provide various improvements, no particular result is a requirement of the present disclosure unless explicitly recited in a particular claim.

Figure 1A:
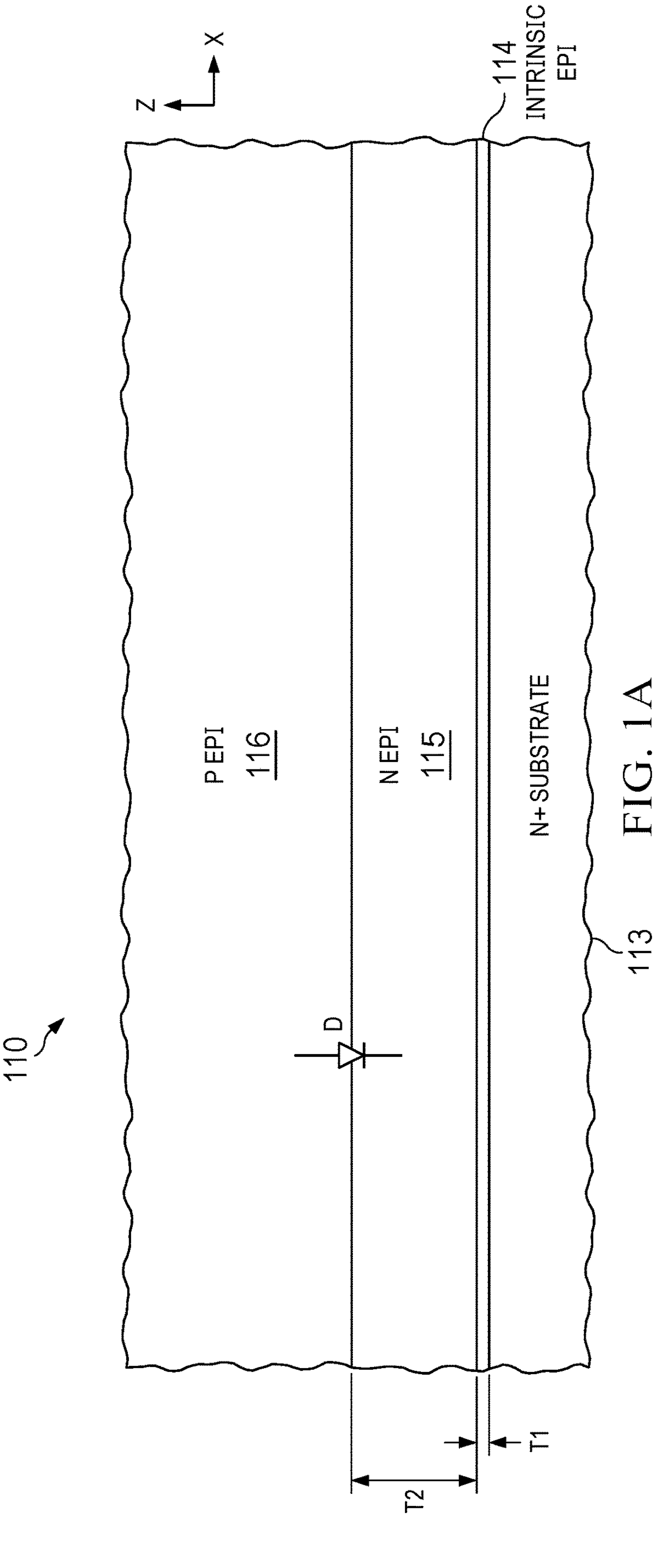
FIG. 1A a is a partial sectional side elevation view of a diode in a stack of epitaxial layers on a substrate.
Figure 1B:
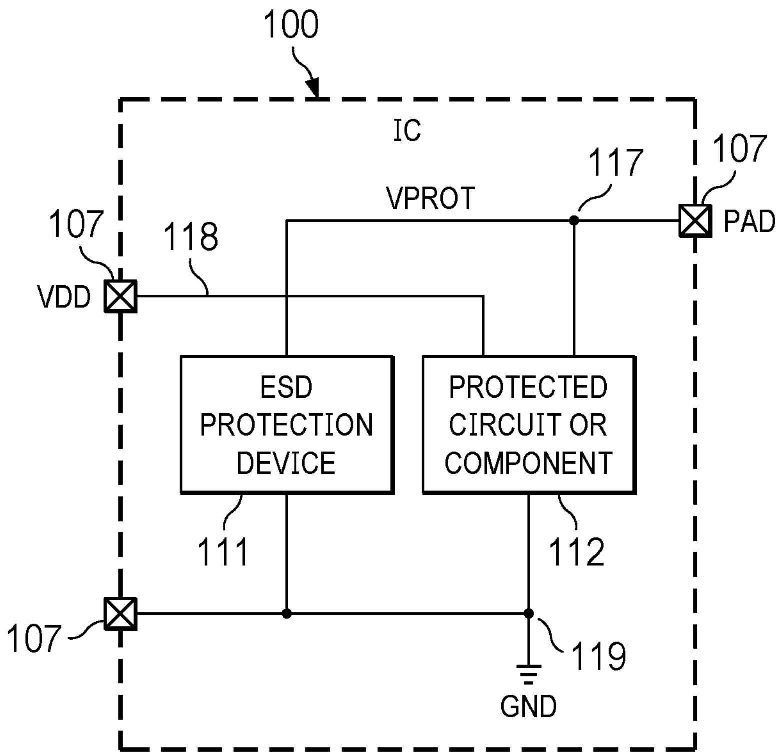
FIG. 1B is a simplified schematic diagram of the electronic device of FIG. 1.
Figure 1C:
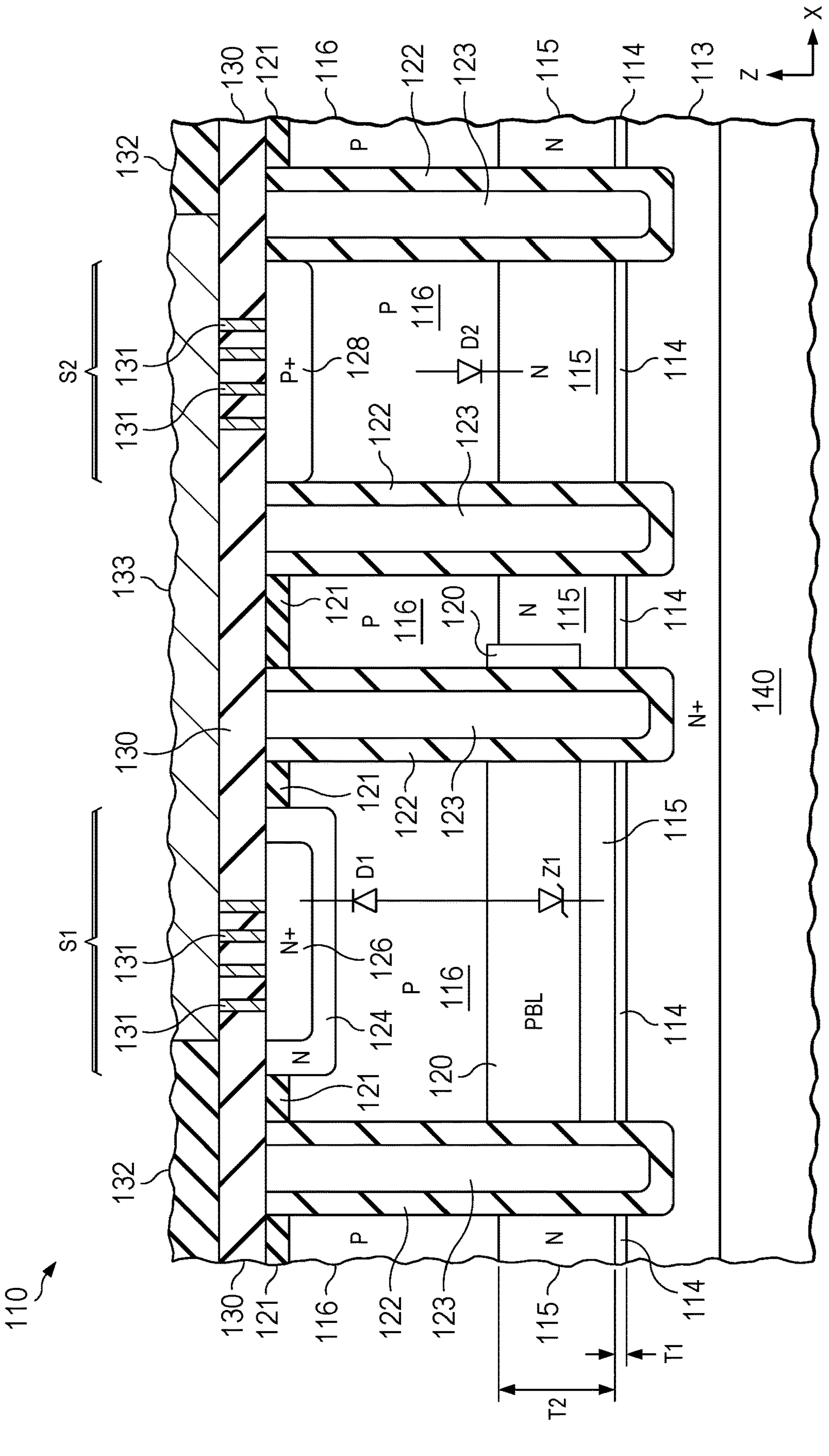
FIG. 1C is a partial sectional side elevation view of an example implementation of the ESD protection circuit.

Referring initially to FIGS. 1-1C, FIG. 1 shows an electronic device 100, such as an integrated circuit having a semiconductor die 110 that includes an ESD protection circuit 111, FIG. 1A a shows a diode D in a stack of epitaxial layers on a substrate of the semiconductor die 110, FIG. 1B shows a schematic diagram of one implementation of the electronic device 100, and FIG. 1C shows an example implementation of the ESD protection circuit 111. In one example, the electronic device 100 includes a protected circuit or component 112 (FIGS. 1 and 1B), for example, formed in the same semiconductor die 110 with the ESD protection circuit 111.

In another implementation, the protection circuit 111 can be packaged in a corresponding packaged electronic device 100, for example, for use in protecting a separate electronic device (e.g., another integrated circuit) with respect to ESD events in a system, such as a printed circuit board (not shown). In another example, the protection circuit 111 is included in a semiconductor die 110 and the protected circuit 112 is formed in a second semiconductor die (not shown), and the first and second semiconductor dies are packaged together in a common electronic device that can be mounted to a host circuit board (not shown).

FIGS. 1, 1A and 1C illustrate an example quad flat package electronic device 100 and the semiconductor die 110 in an example three-dimensional space with a first direction X, a perpendicular (orthogonal) second direction Y, and a third direction Z (FIG. 1) that is perpendicular (orthogonal) to the respective first and second directions X and Y. Structures or features along any two of these directions are orthogonal to one another. As shown in FIG. 1, the electronic device 100 has opposite first and second (e.g., bottom and top) sides 101 and 102, respectively, which are spaced apart from one another along the third direction Z in the illustrated position. The electronic device 100 also has opposite third and fourth sides 103 and 104 (e.g., lateral sides) that are spaced apart from one another along the first direction X, and fifth and sixth sides 105 and 106 that are spaced apart from one another along the second direction Y in the illustrated position.

In the illustrated example, the electronic device 100 has electrically conductive leads or terminals 107 along the four lateral sides 103-106 that are exposed along the bottom first side 101 and along respective ones of the lateral sides 103-106 of a molded or ceramic package structure 108. In different implementations, the ESD protection circuit 111 can be packaged in a different type or form of package with suitable conductive leads allowing the packaged electronic device to be soldered to a host circuit board or installed in a socket (not shown) of a host system.

Illustrated examples provide p-n junctions within an electronic device, such as one or more diodes with a p-n junction of epitaxial silicon or other semiconductor material formed (e.g., grown) above a semiconductor substrate. The junction and diode can be useful in one example in ESD protection circuitry that is integrated into a common semiconductor die with a protected circuit and/or in a dedicated ESD protection device that can be mounted onto a circuit board in close proximity to a protected device, such as an integrated circuit.

FIG. 1A shows an example diode D with a p-n junction formed in a stack that includes one or more epitaxial silicon layers above a silicon substrate. Different semiconductor material types can be used for the various described layers in other examples, such as gallium arsenide, etc. The illustrated portion of the semiconductor die 110 has a doped silicon substrate 113 (labeled "N+ SUBSTRATE") that is doped with n-type dopants, such as phosphorus, arsenic, etc., and the n-type substrate 113 has a first concentration of n-type dopants. In some examples, the first concentration of the n-type dopants of the substrate 113 may be greater than $1\times10^{18}$ $cm^{-3}$; and in some examples, the first concentration may exceed $5\times10^{19}$ $cm^{-3}$. In these or another example, the n-type substrate 113 can have a resistance range of approximately 0.0011 to 0.0013 Ohm-Centimeter. An intrinsic epitaxial silicon layer 114 with a second concentration of n-type dopants extends on a top side of the substrate 113 and is labeled "INTRINSIC EPI" in FIG. 1A. The second concentration of n-type dopants of the intrinsic epitaxial silicon layer 114 is less than the first concentration of n-type dopants of the n-type substrate 113. In some examples, the second concentration of n-type dopants of the intrinsic epitaxial silicon layer 114 may be less than $1\times10^{14}$ $cm^{-3}$; and in some examples, may be less than $1\times10^{13}$ $cm^{-3}$.

The stack in FIG. 1A also includes an n-type epitaxial layer 115 on the intrinsic epitaxial layer 114, which can also be referred to as a device epitaxial film. The n-type epitaxial layer 115 has a third concentration of n-type dopants that is greater than the second concentration of n-type dopants. In some examples, the third concentration of n-type dopants of the n-type epitaxial layer 115 may vary between $1\times10^{15}$ $cm^{-3}$ and $1\times10^{17}$ $cm^{-3}$. In these or another example, the n-type epitaxial layer 115 can have a resistance range of approximately 0.70 to 0.80 Ohm-Centimeter. A p-type epitaxial silicon layer 116 extends on the n-type epitaxial layer 115, and includes p-type dopants (e.g., boron, etc.). In another example, a p-type buried layer (e.g., PBL, not shown) extends in an upper portion of the n-type epitaxial layer 115 and into a lower portion of the p-type epitaxial silicon layer 116. The illustrated stack portion provides a p-n junction that forms a diode D schematically shown in FIG. 1A.

The illustrated stack structure advantageously includes the intrinsic epitaxial layer 114 that is formed in a separate deposition process to mitigate diffusion of n-type dopants from the substrate 113 into the n-type epitaxial layer 115 during epitaxial layer formation processing. This provides benefits compared to instead forming (e.g., growing) the n-type epitaxial layer 115 directly on the top side of the n-type substrate 113. In particular, the latter approach results in out-diffusion of n-type dopants from the substrate 113 into the n-type epitaxial layer 115 with spatial variations in the n-type dopant concentration in the n-type epitaxial layer 115, which can lead to reduced production yield with respect to breakdown voltage variations in die areas between the center and edges of a wafer as a result of wafer rotation during epitaxial layer formation processing.

The intrinsic epitaxial layer 114 in one example includes a non-zero concentration of n-type dopants, for example, due to some diffusion of n-type dopants from the substrate 113 into the intrinsic epitaxial layer 114 during formation of the intrinsic epitaxial layer 114 by epitaxial growth or deposition and associated processing. In one example, the intrinsic epitaxial layer 114 has a first thickness T1 of 0.1 μm or more. In this or another example, the thickness T1 of the intrinsic epitaxial layer 114 is 1.5 μm or less. In these or another example, the n-type epitaxial layer 115 has a second thickness T2, and the second thickness T2 is greater than the first thickness T1. With respect to p-n junction of the diode D, the final n-type epitaxial film thickness includes the thickness T1 of the intrinsic epitaxial film layer 114 and the n-type epitaxial layer thickness T2.

FIG. 1B shows an example circuit configuration of the ESD protection circuit 111 to provide protection for a protected circuit or component 112 against adverse effects associated with an ESD event. The electronic device 100 in this example includes the protected circuit or component 112, which is connected between a protected pad 107 (e.g., IC terminal, pin, pad, etc.) and an associated protected internal node 117, and a reference voltage (e.g., GND). The protected pad 107 has a voltage labeled "PAD" in FIG. 1B. The electronic device 100 also includes a power pad 107 (e.g., to receive a supply voltage VDD), and an internal node 118 that connects the supply voltage from the power pad 107 to the protected circuit or component 112.

The protected circuit or component 112 in this example is connected between the protected pad 107 (e.g., the protected node 117) and a reference node 119 (GND). The ESD protection circuit 111 is connected in parallel with the protected circuit or component 112. In this example, the electronic device 100 is an integrated circuit electronic device 100 with the protected circuit or component 112 connected to an externally accessible terminal or pad 107, and the ESD protection circuit 111 is electrically connected to the externally accessible terminal or pad 107 of the IC 100.

The ESD protection circuit 111 protects the circuit or component 112 against ESD events associated with the externally accessible electrically conductive pad structure 107, for example, when the protected pad is soldered to a host printed circuit board (PCB) or otherwise subject to hot-plug surges, switching noise or other transient voltage conditions. In steady state operation, with a supply voltage provided to the VDD pad 107, voltage levels at the protected pad 107 below the breakdown voltage rating of the ESD protection circuit 111 will not trigger conduction by the ESD protection circuit 111, and the protected circuit or component 112 operates in a normal designed fashion. The vertical stack structure of one or more protection diodes of the ESD protection circuit 111 (e.g., as described with reference to FIGS. 1A and 1C) in one example can help provide a low capacitance to the protected node or pad 107 to facilitate desired operation of the protected circuit or component 112.

If an ESD event occurs at the protected pad 107, the associated protected node voltage VPROT rises quickly, for example, with a fast rise time in a high voltage human body model (HBM) ESD test event. The fast voltage rise causes voltage breakdown within the ESD protection circuit 111 that conducts the ESD event current through the ESD protection circuit 111 to mitigate or avoid excessive current flow in the protected circuit or component 112.

FIG. 1C shows an example implementation of the ESD protection circuit 111 of the semiconductor die 110 that includes a first stack S1 and a second stack S2. The stacks S1 and S2 in this example include example portions of the substrate 113 and the epitaxial layers 114-116 as described above in connection with FIG. 1A. The first stack S1 includes a first portion of the n-type substrate 113, a first portion of the intrinsic epitaxial layer 114 on the first portion of the n-type substrate 113, a first portion of the n-type epitaxial layer 115 on the first portion of the intrinsic epitaxial layer 114, and a first portion of the p-type epitaxial layer 116 over the first portion of the n-type epitaxial layer 115.

In addition, the first stack S1 includes an n-type region 124, 126 in an upper portion of the first portion of the p-type epitaxial layer 116. In one example, the n-type region includes a diffused n-type region 124 and an n-type source/drain (NSD) implanted region 126 within the diffused n-type region 126. The n-type region 124, 126 is spaced apart from (e.g., above) the first portion of the n-type epitaxial layer 115 to form a cathode of a first diode D1. The anodes of the first diode D1 and the Zener diode Z1 are connected together in this example and form a diode circuit with a triggerable bipolar transistor structure that can be triggered by an ESD event to conduct current during the ESD event when a protected node voltage (e.g., VPROT in FIG. 1B) exceeds a first trigger voltage that is above a normal operating voltage for the protected circuit or component 112.

The second stack S2 in FIG. 1C is a laterally spaced apart from the first stack S1 (e.g., along the first direction X. The second stack S2 in this example includes a second portion of the n-type substrate 113, a second portion of the intrinsic epitaxial layer 114 on the second portion of the n-type substrate 113, a second portion of the n-type epitaxial layer 115 on the second portion of the intrinsic epitaxial layer 114, and a second portion of the p-type epitaxial layer 116 on the second portion of the n-type epitaxial layer 115. In addition, the second stack S2 includes a p-type region 128, such as a p-type source/drain implant region (PSD) in the second portion of the p-type epitaxial layer 116. The p-type region 128 is spaced apart from (e.g., above) the second portion of the n-type epitaxial layer 115 along the third direction Z. An interface between the second portion of the p-type epitaxial layer 116 and the second portion of the n-type epitaxial layer 115 forms a p-n junction of a second diode D2 schematically illustrated in FIG. 1C.

The semiconductor die 110 of the electronic device 100 in the example of FIG. 1C also includes p-doped regions 121 along portions of the top side of the p-type epitaxial layer 116. In addition, the electronic device 100 in this example also includes one or more instances of a deep trench isolation structure 122, 123 that extends along the third direction Z through the intrinsic epitaxial layer 114, the n-type epitaxial layer 115, and the p-type epitaxial layer 116 and into the n-type substrate 113 and separates the first and second stacks S1, S2. Each instance of the deep trench isolation structure in one example includes an oxide or other suitable trench wall liner 122 and doped polysilicon 123 enclosed by the liner 122. The illustrated section view of FIG. 1C includes two deep trench structures extending between the first and second stacks S1 and S2, for example, corresponding to sidewalls of the first and second deep trench ring or box structures that laterally surround the respective first and second stacks S1 and S2.

The p-type region 120 (e.g., PBL) in the illustrated example extends within the example first deep trench ring or box structure 122, 123 that laterally surrounds the first stack S1. Moreover, the region laterally between the first and second deep trench structures 122, 123 (e.g., the region between the first and second stacks S1 and S2) includes a p-type region, for example, as a result of implantation of the PBL p-type region 120 prior to deep trench structure formation during fabrication, although not a requirement of all possible implementations.

The semiconductor die 110 in this example further includes a metallization stricture 131, 133 that couples the cathode of the first diode D1 to the anode of the second diode D2 to form the electrostatic discharge ESD protection circuit 111. The metallization structure in this example includes a first or pre-metal dielectric (PMD) layer 130 with tungsten metal contacts 131 forming connections to the n-type region 124, 126 and to the p-type region 128, as well as a first interlayer or interlevel dielectric (ILD) layer 132 with a conductive metal trace or via feature 133 electrically connected to the illustrated tungsten contacts 131 to electrically couple the cathode of the first diode D1 to the anode of the second diode D2. The cathodes of the Zener diode Z1 and the second diode D2 are connected through the substrate 113 to a backside metal structure 140, for example, to provide a conduction path for ESD event current.

Figure 2:
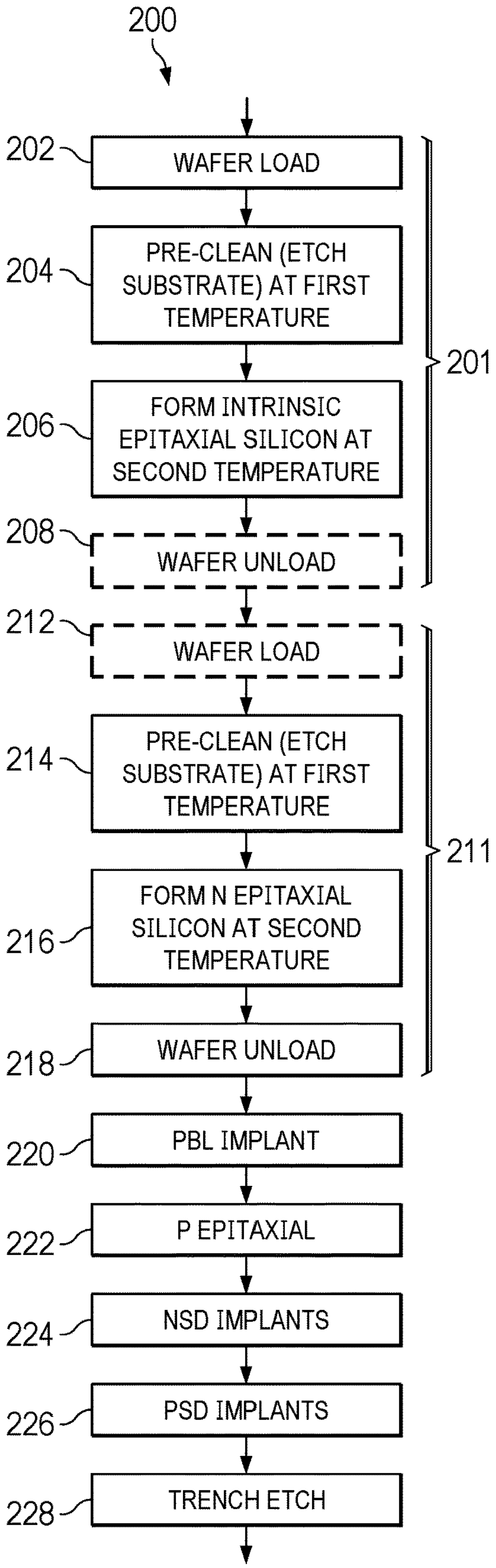
FIG. 2 is a flow diagram of a method of fabricating electronic devices.
Figure 2A:
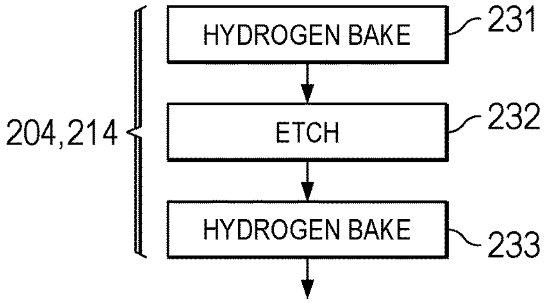
FIG. 2A a is a flow diagram of an example preclean process in an implementation of the method of FIG. 2.
Figure 3:
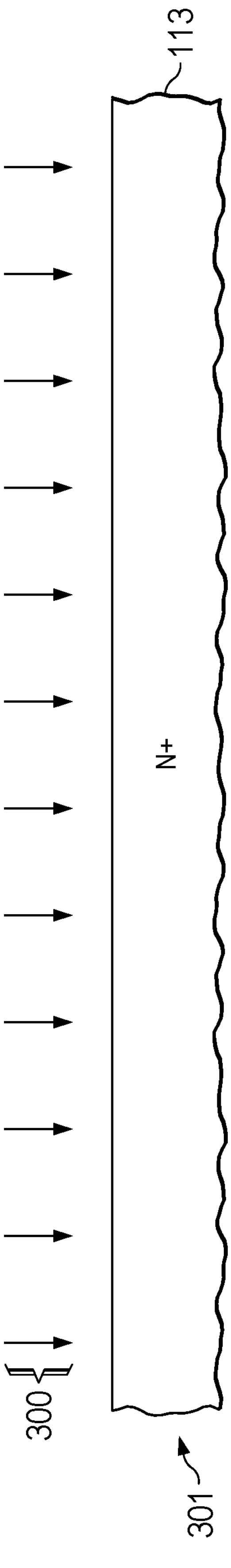
FIGS. 3-15 are partial sectional side elevation views of a wafer undergoing fabrication processing according to the method of FIGS. 2 and 2A.

FIGS. 2 and 2A illustrate an example process or method 200 of fabricating electronic devices. More specifically, FIG. 2A illustrates an example preclean process (e.g., at 204, 214) in an implementation of the method of FIG. 2. FIGS. 3-15 show the above described semiconductor die 110 undergoing fabrication according to the method 200. In the illustrated example, the above-described first and second stacks S1 and S2 are concurrently formed through various deposition and implantation processes.

The method 200 begins at 201 in FIG. 2 with forming (e.g., growing) the intrinsic epitaxial layer 114 on a starting n-type substrate 113. FIGS. 3-6 show one example of the intrinsic epitaxial layer formation at 201 of FIG. 2 on a starting semiconductor wafer (or a semiconductor substrate) 301. The wafer 301 can be any suitable semiconductor substrate, such as a silicon wafer or wafer of other types semiconductor material. The substrate 301 in this example includes n-type dopants (e.g., labeled "N+"), such as phosphorus. The wafer 301 is loaded at 202 in FIG. 2 into an epitaxial deposition process chamber (not shown) via a wafer load process 300 shown in FIG. 3, and the loaded wafer is rotated while the processing chamber is purged, and the chamber temperature is increased.

Figure 4:
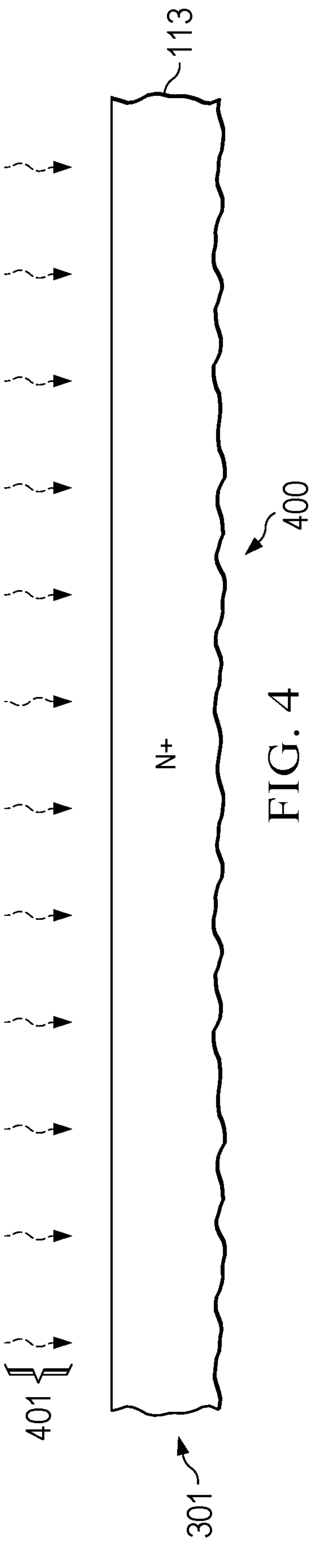
Figure 4A:
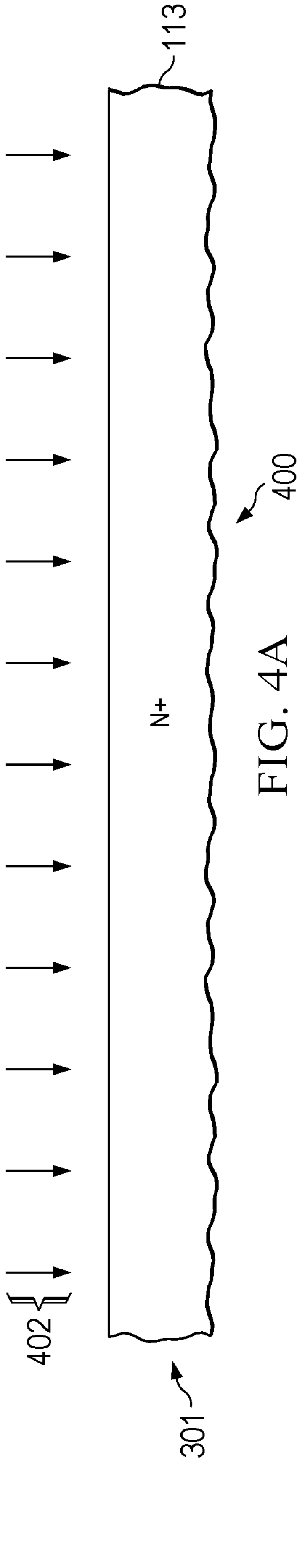
Figure 4B:
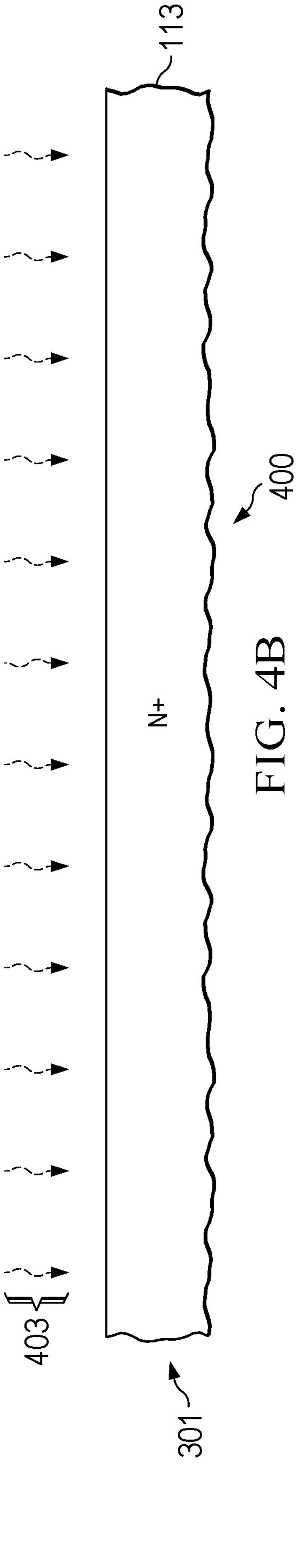

At 204 in FIG. 2, a preclean process is performed at a first temperature. FIGS. 4-4B show one example, in which a preclean process 400 is performed to clean the wafer surface before forming the intrinsic epitaxial silicon layer. FIG. 2A shows one example preclean process performed at 204 in FIG. 2. In this example, a first hydrogen bake process is performed in FIG. 2A at 231 followed by wafer etching at 232, and a second hydrogen bake process at 233. FIG. 4 shows one example, in which a first hydrogen bake process 401 is performed (e.g., 231 in FIG. 2A) in a hydrogen environment (e.g., $H_2$) at a first temperature (e.g., labeled "TEMP1" in FIG. 16 below) with the wafer 301 rotating. In some examples, the load temperature at which the wafer is loaded into the chamber is approximately 850 degrees C., the first temperature (e.g., TEMP 1) of the first hydrogen bake process 401 before etching is stabilized to 1150 degrees C. and the process chamber is controlled to increase the temperature from load (e.g., approximately 850 degrees C.) to the pre etch first temperature of approximately 1150 degrees C. The range is 850 C~1150 C] The wafer top side is then chemically etched by performing an etch process 402 in FIG. 4A (e.g., 232 in FIG. 2A). In some examples, the etch process 402 includes a pre clean condition with the temperature of approximately 1150 degrees C. at atmospheric pressure for a process time of approximately 30 s with H2 and HCL gas to etch approximately 0.1 μm of silicon. In FIG. 4B, a second hydrogen bake process 403 is performed (e.g., 233 in FIG. 2A). In some examples, the temperature decreases during the second hydrogen bake process 403 from approximately 1150 degrees C. to approximately 1050 degrees C.

Figure 5:
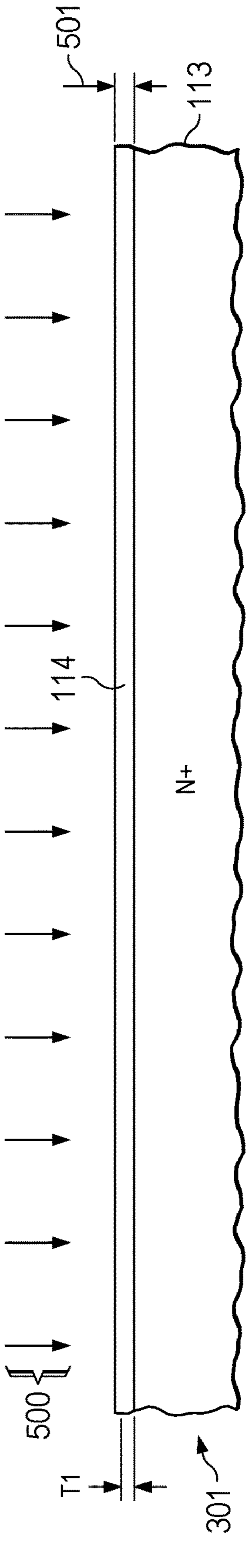

The method 200 continues at 206 of FIG. 2 with growing the intrinsic epitaxial layer 114 on the cleaned top side of the wafer 301. FIG. 5 shows one example, in which an epitaxial growth process 500 is performed that forms (e.g., grow) the intrinsic epitaxial layer 114. In one example, the epitaxial growth process 500 is performed (e.g., at 206 in FIG. 2) at a second temperature (e.g., labeled "TEMP2" in FIG. 16 below) that is less than the first temperature TEMP1. In some examples, the second temperature (TEMP2) is an epitaxial film deposition temperature of approximately 1050 degrees C. (e.g., +/−10 degrees C.). In one implementation, n-type dopants (e.g., phosphorus) can diffuse out of the substrate 113 and into the intrinsic epitaxial layer 114, and the finished intrinsic epitaxial layer 114 includes at least some of the diffused n-type dopants. In the illustrated example, the intrinsic epitaxial layer 114 is grown at a starting thickness 501 as shown in FIG. 5, which is greater than the target first thickness T1, since the subsequent preclean etch processing (e.g., at 214 in FIG. 2) will reduce the thickness to the desired target first thickness T1.

Figure 6:
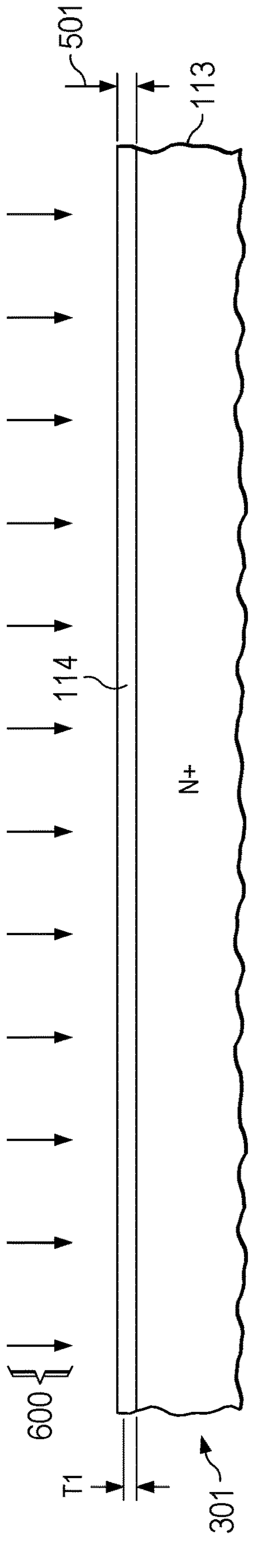

In one example, the method 200 proceeds to formation of the n-type epitaxial layer 115 at 211. In the illustrated example, the method 200 includes unloading the wafer 301 at 208 from the process chamber after growing the intrinsic epitaxial layer 114 at 206. FIG. 6 shows one example, in which an unloading process 600 is performed that removes the wafer 301 from the processing chamber before beginning the n-type epitaxial layer formation at 211. In one implementation, the process chamber can be evacuated and/or cleaned after unloading the wafer at 208—e.g., purged to remove the n-type dopants remaining in the process chamber.

Figure 7:
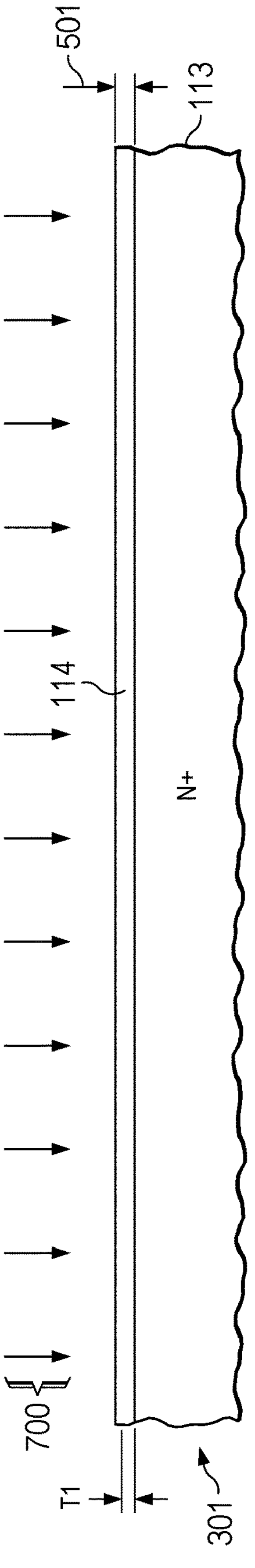

The method 200 continues at 211 in FIG. 2 with growing the n-type epitaxial layer 115 having the third concentration of n-type dopants on the intrinsic epitaxial layer 114. In one example, the processing at 211 is similar to the processing at 201, but with the addition of n-type dopants during epitaxial layer formation at 216. In this example, the method 200 includes wafer reloading at 212 in FIG. 2. FIG. 7 shows one example, in which a wafer loading (e.g., reloading) process 700 is performed that loads the wafer 301 into the process chamber.

Figure 8:
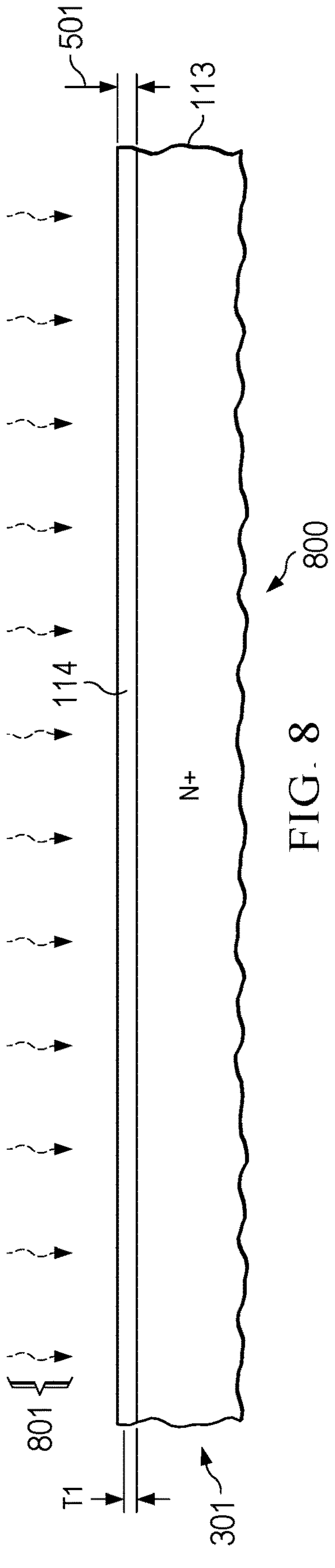
Figure 8A:
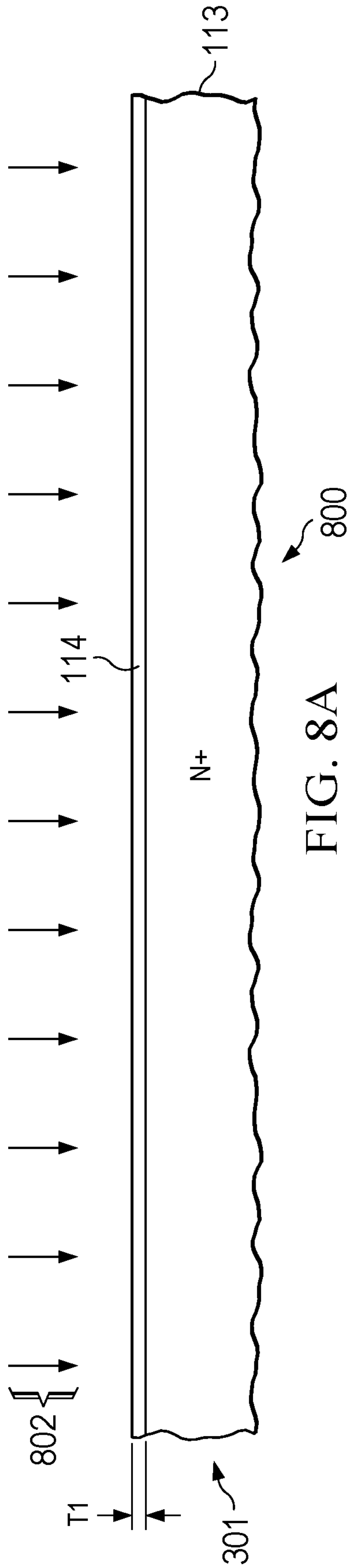
Figure 8B:
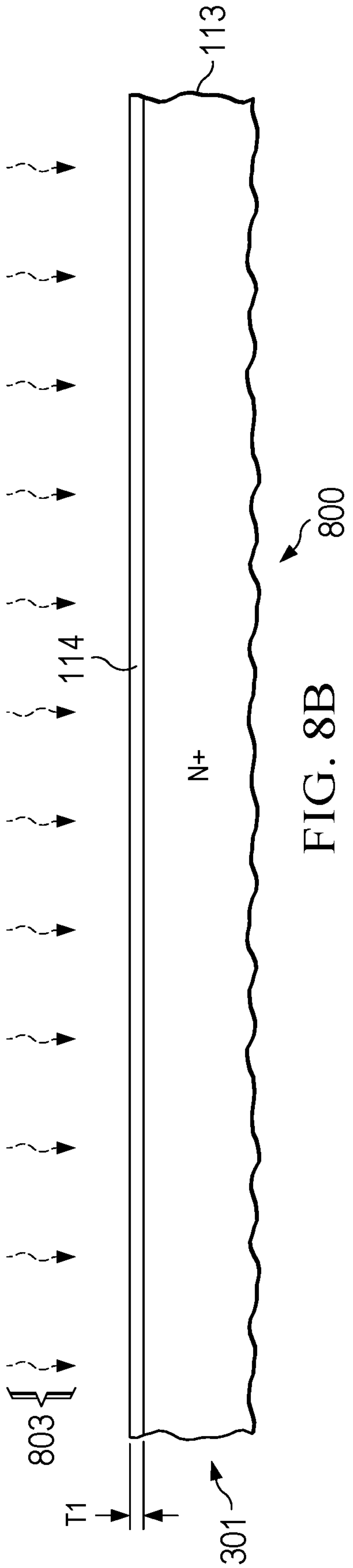

The method 200 continues in FIG. 2 at 214 after reloading the wafer 301 into the process chamber, with another preclean operation at the first temperature (e.g., TEMP1). FIG. 8-8B show one example, in which a preclean process 800 is performed to clean the wafer surface before forming the n-type epitaxial layer 115. FIG. 2A shows one example preclean process performed at 214 in FIG. 2. In this example, a first hydrogen bake process is performed in FIG. 2A at 231 followed by wafer etching at 232, and a second hydrogen bake process at 233. FIG. 8 shows one example, in which a first hydrogen bake process 801 is performed (e.g., 231 in FIG. 2A) in a hydrogen environment (e.g., $H_2$) at the first temperature (e.g., labeled "TEMP1" in FIG. 16 below) with the wafer 301 rotating. The wafer top side is then chemically etched by performing an etch process 802 in FIG. 8A (e.g., 232 in FIG. 2A). As a result of the etch process 802, the thickness 501 is reduced to T1. In FIG. 8B, a second hydrogen bake process 803 is performed (e.g., 233 in FIG. 2A).

Figure 9:
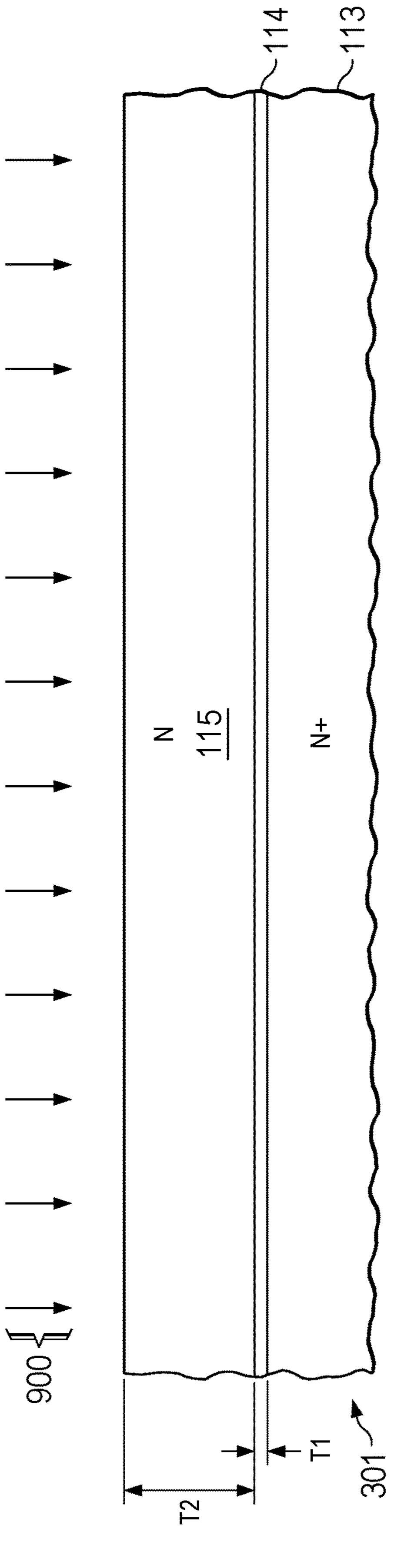
Figure 10:
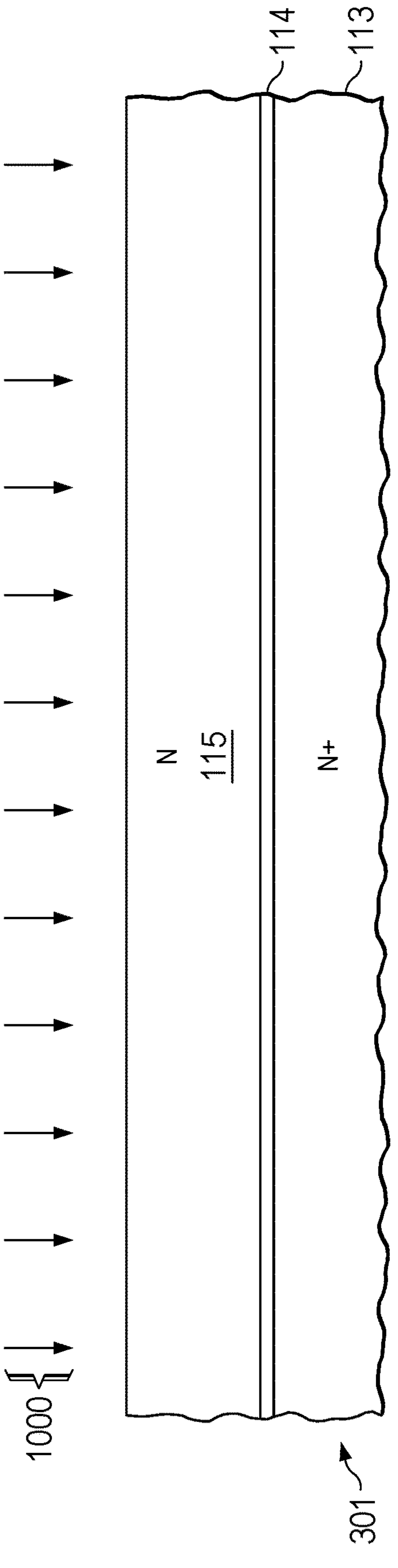

The method 200 continues at 216 and FIG. 2 with growing the n-type epitaxial layer 115 on the cleaned top side of the intrinsic epitaxial layer 114. FIG. 9 shows one example, in which an epitaxial growth process 900 is performed that forms (e.g., grow) the n-type epitaxial layer 115 on the intrinsic epitaxial layer 114. In one example, the epitaxial growth process 900 is performed (e.g., at 216 in FIG. 2) at a second temperature (e.g., labeled "TEMP2" in FIG. 16 below) that is less than the first temperature TEMP1. The epitaxial growth process 900 in one example is performed in an environment that includes n-type dopants (e.g., phosphorus, arsenic, etc.) and the n-type epitaxial layer 115 formed at 216 includes the third concentration of n-type dopants. The wafer 301 is then unloaded at 218, where FIG. 10 shows one example, in which an unloading process 1000 is performed that unloads the wafer 301 from the epitaxial deposition processing chamber.

Figure 11:
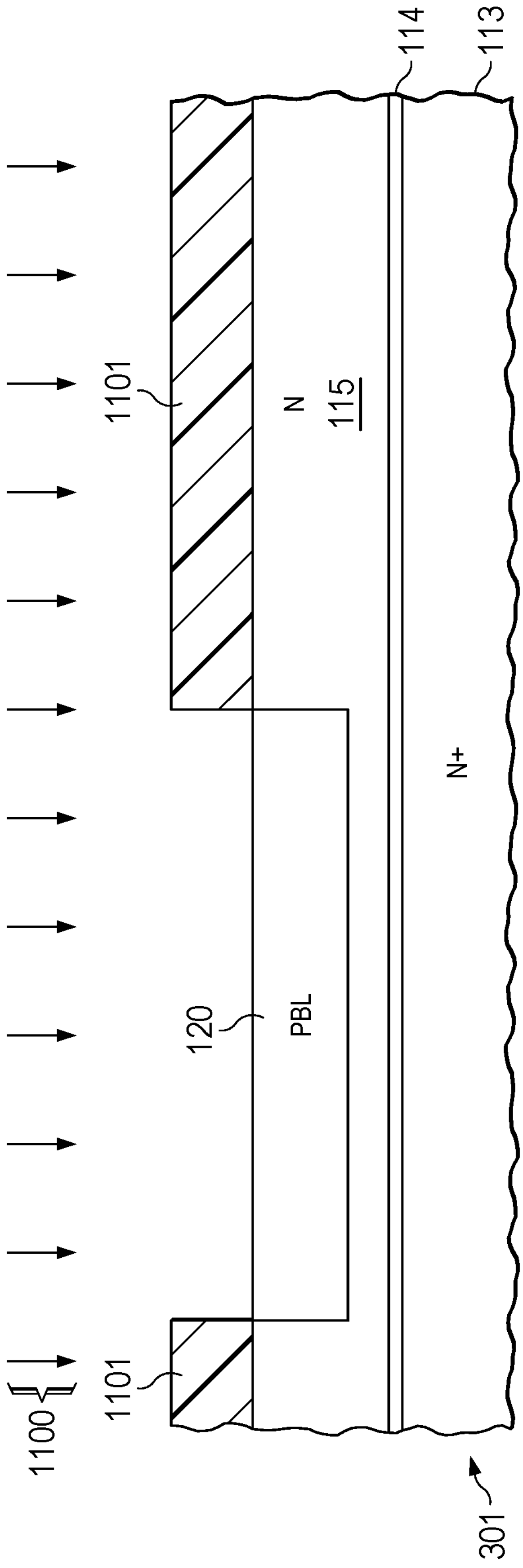

The method 200 continues at 220 in FIG. 2 with p-type dopants implants to form the p-type region 120 (e.g., buried layer). FIG. 11 shows one example, in which an implantation process 1100 is performed with an implant mask 1101 that exposes the prospective p-type implanted region 120. The implantation process 1100 implants p-type dopants (e.g., boron, etc.) into the exposed upper portion of the n-type epitaxial layer 115 to form the p-type region 120 (e.g., labeled "PBL" in FIG. 11) in the first portion of the n-type epitaxial layer 115, which is spaced apart from (e.g., above) the n-type substrate 113.

Figure 12:
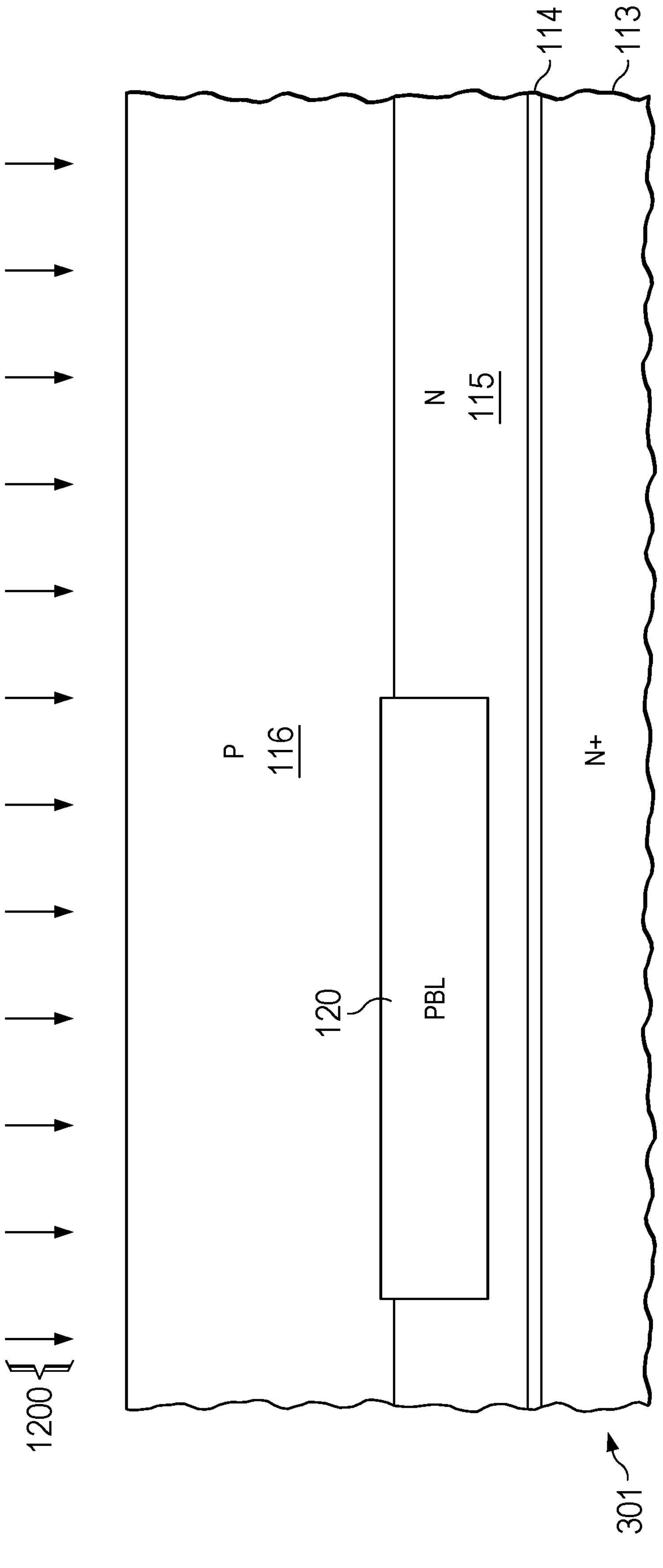

The method 200 continues at 222 in FIG. 2 with formation of the p-type epitaxial layer 116. FIG. 12 shows one example, in which another epitaxial growth deposition process 1200 is performed that forms the p-type epitaxial layer 116 on the n-type epitaxial layer 115. As seen in FIG. 12, dopants from the p-type region 120 in one example diffuse upward into a lower portion of the epitaxially grown p-type epitaxial layer 116.

Figure 13:
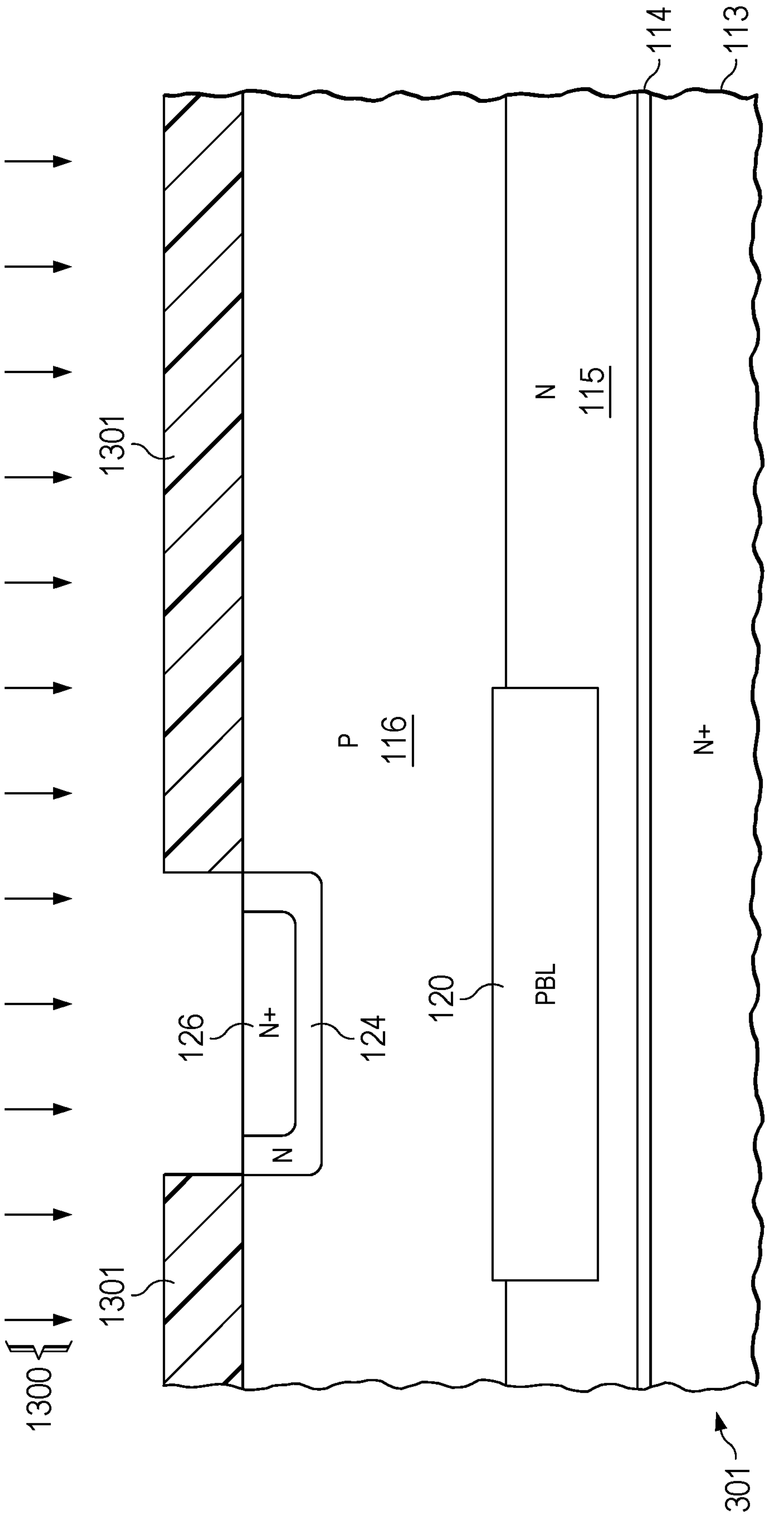

At 224 and 226 in FIG. 2, the method 200 continues with source drain implants, including n-type source drain (NSD) implantation at 224. FIG. 13 shows one example, in which an implantation process 1300 is performed using a mask 1301. The implantation process 1300 implants n-type dopants (e.g., phosphorus) into the exposed region 126 along the top side of the p-type epitaxial layer 116 in order to create the n-type region 126 and subsequent annealing diffuses n-type dopants to form the diffused n-type region 124. The n-type region 124, 126 is spaced apart from (e.g., above) the first portion of the n-type epitaxial layer 115, and also above a portion of the p-type region 120 as shown in FIG. 13.

Figure 14:
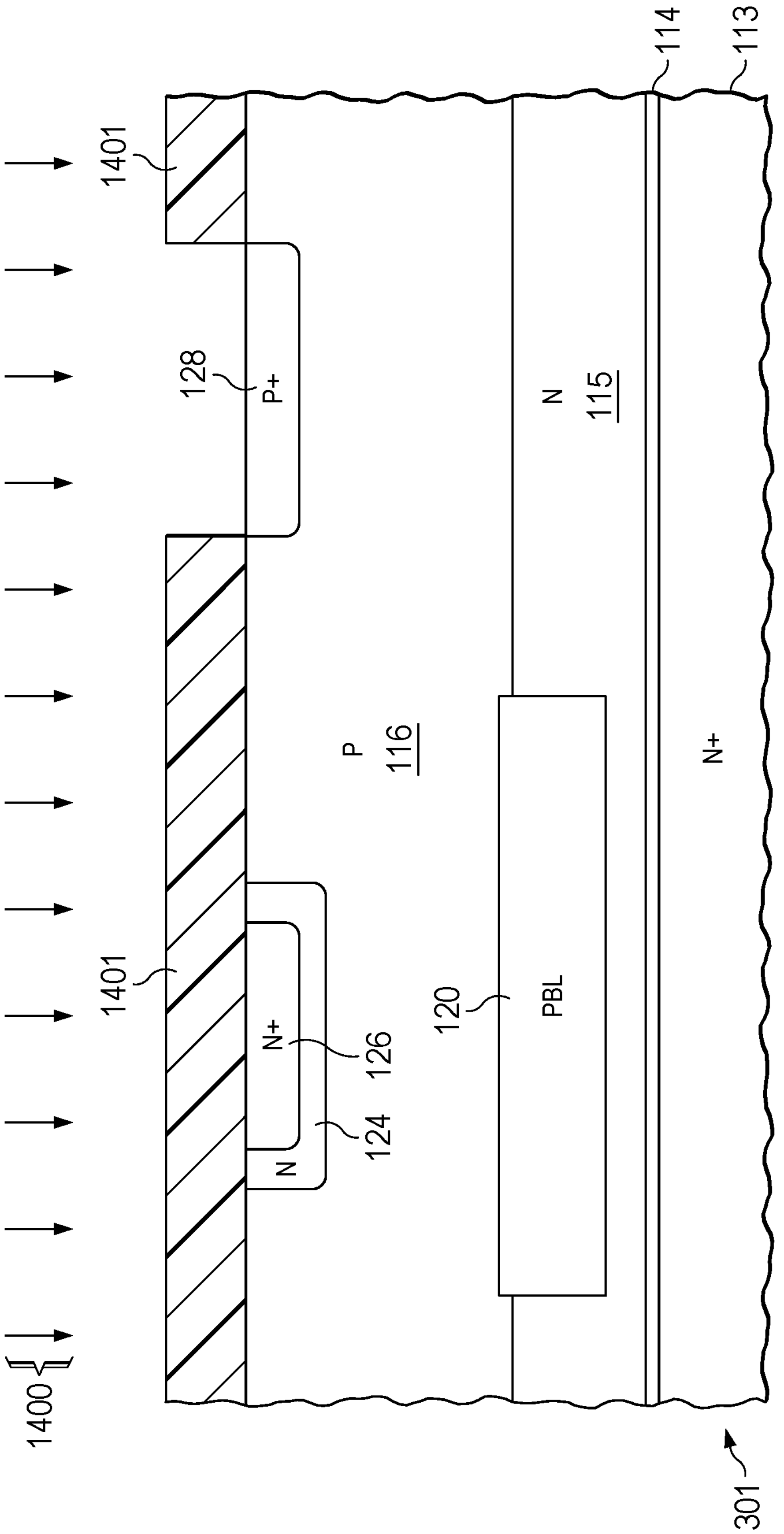

At 226, the method 200 continues in FIG. 2 with p-type source drain (PSD) implants. FIG. 14 shows one example, in which an implantation process 1400 is performed with a mask 1401 to implant p-type dopants (e.g., boron) in the second portion of the p-type epitaxial layer 116 to form the p-type region 128 that is spaced apart from (e.g., above) the second portion of the n-type epitaxial layer 115.

Figure 15:
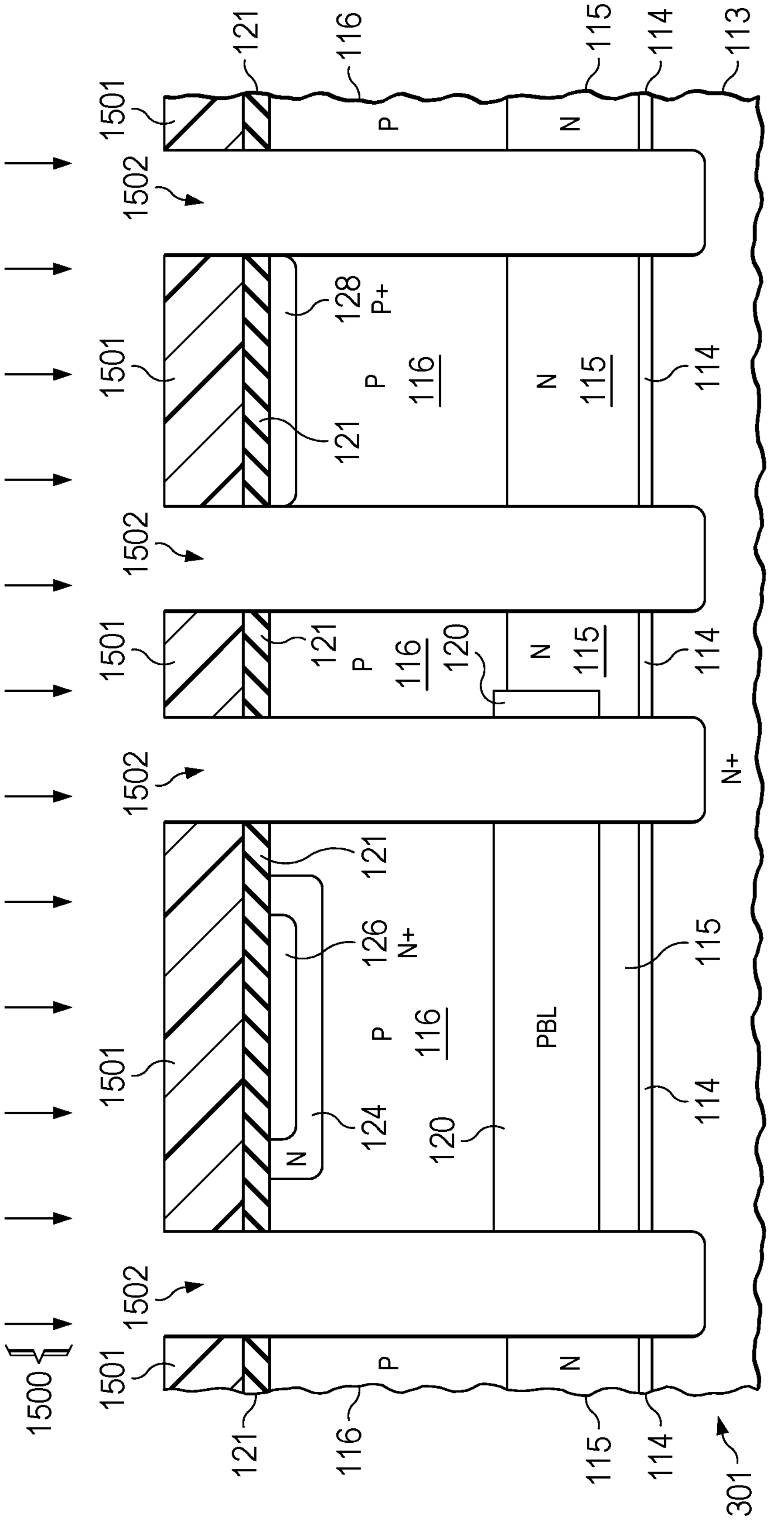

The example method 200 continues at 228 with etching one or more trenches—e.g., to form four lateral deep trench isolation structures described with reference to FIG. 1C. FIG. 15 shows one example, in which an etch process 1500 is performed using an etch mask 1501 that forms trenches 1502 between the respective first and second stacks S1 and S2. The trenches 1502 extend through the intrinsic epitaxial layer 114, the n-type epitaxial layer 115, and the p-type epitaxial layer 116 and into the n-type substrate 113 as shown in FIG. 15. Further wafer level processing and packaging steps can be performed to finish the packaged electronic device 100 (not shown in FIG. 2).

Figure 16:
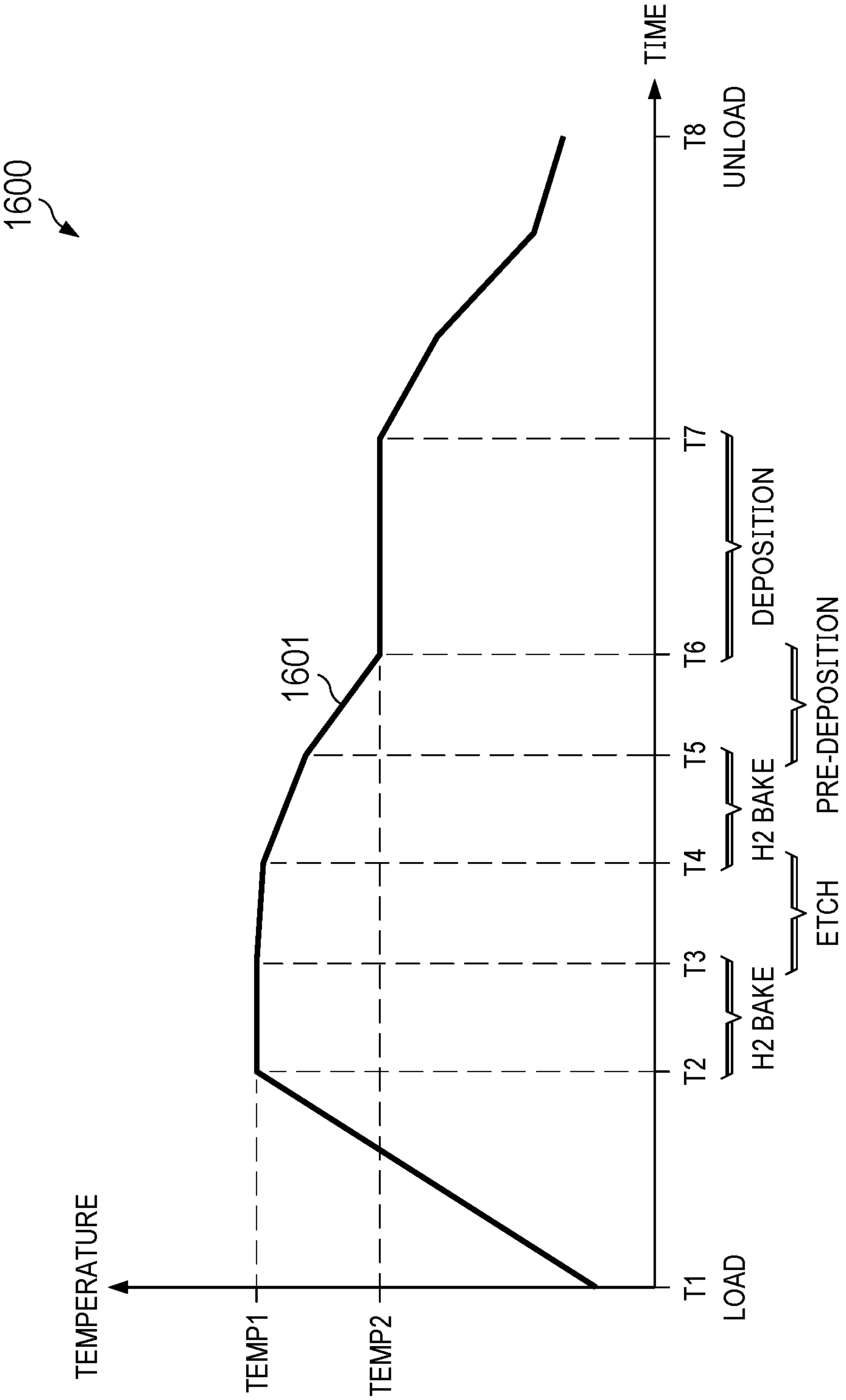
FIG. 16 is a graph of temperature as a function of time for an example intrinsic layer deposition.

FIG. 16 is a graph of temperature as a function of time for an example intrinsic layer deposition. Namely, FIG. 16 shows a graph 1600 with a curve 1601 that shows wafer temperature as a function of time, for example to form the intrinsic epitaxial layer 114 at 201 in FIG. 2 above, and similar processing can be used at 211 in FIG. 2 to form the n-type epitaxial layer 115 in one example. The wafer 301 is loaded at time T1 in the graph 1600, and the temperature is increased to the first temperature TEMP1 from T1 to time T2 while the wafer 301 is rotated. From time T2 to time T3, the first hydrogen bake process is carried out (e.g., at 231 in FIG. 2A above), and the preclean etch is performed (e.g., 232 in FIG. 2A) is performed from T3 to time T4 in FIG. 16. From T4 to time T5 in FIG. 16, the second hydrogen bake process is performed (e.g., 233 in FIG. 2A), which is followed by a pre-deposition process from T5 to time T6 while the temperature is brought down to the second temperature TEMP2. The epitaxial deposition processing is performed from T6 to time T7, after which the process chamber temperature is reduced before a wafer unloading process is performed at time T8.

Figure 17:
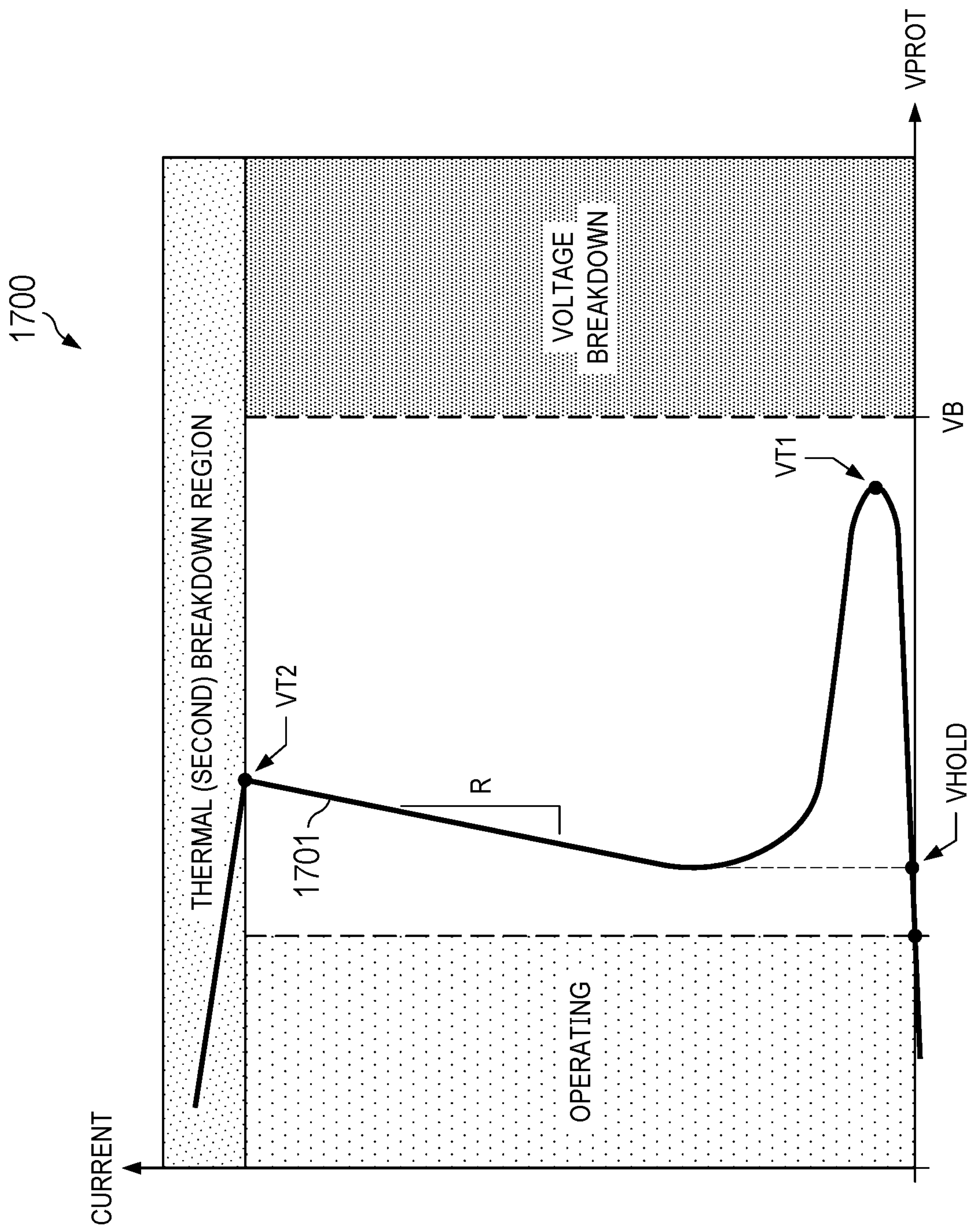
FIG. 17 is a graph of current as a function of voltage for an implementation of the ESD protection circuit.

FIG. 17 is a graph of current as a function of voltage for an implementation of the ESD protection circuit. Namely, FIG. 17 shows a graph 1700 with a curve 1701 that shows current as a function of voltage for an implementation of the ESD protection circuit 111 (e.g., the triggerable bipolar transistor structure D1 and Z1 in FIG. 1C). The ESD protection circuit 111 allows normal operation of the protected circuit, e.g., protected circuit 112 above) at protected node voltages VPROT below the trigger level of the ESD protection circuit 111, shown as an "Operating" range in the graph 1700. Voltage breakdown can occur in a voltage range labeled "Voltage Breakdown" above a breakdown voltage level VB. During a ESD event in which the protected node voltage VPROT is race to a first trigger voltage level VT1, the ESD protection circuit 111 conducts a small amount of current and then triggers snapback operation with the bipolar structure D1, Z1 turning on to conduct increased current with the protected node voltage VPROT reducing to an initial hold voltage level VHOLD, and then rising at a generally linear slope corresponding to a bipolar linear region impedance labeled "R". This operation can successfully conduct ESD event current, for example, through the first stack S1 to the substrate 113 and then to the bottom side metal structure 140 in FIG. 1C. FIG. 17 further shows a second trigger voltage level VT2 above which the current can increase and potentially lead to thermal failure in a high current region labeled "Thermal 2$^{nd}$ Breakdown Region".

Figure 18:
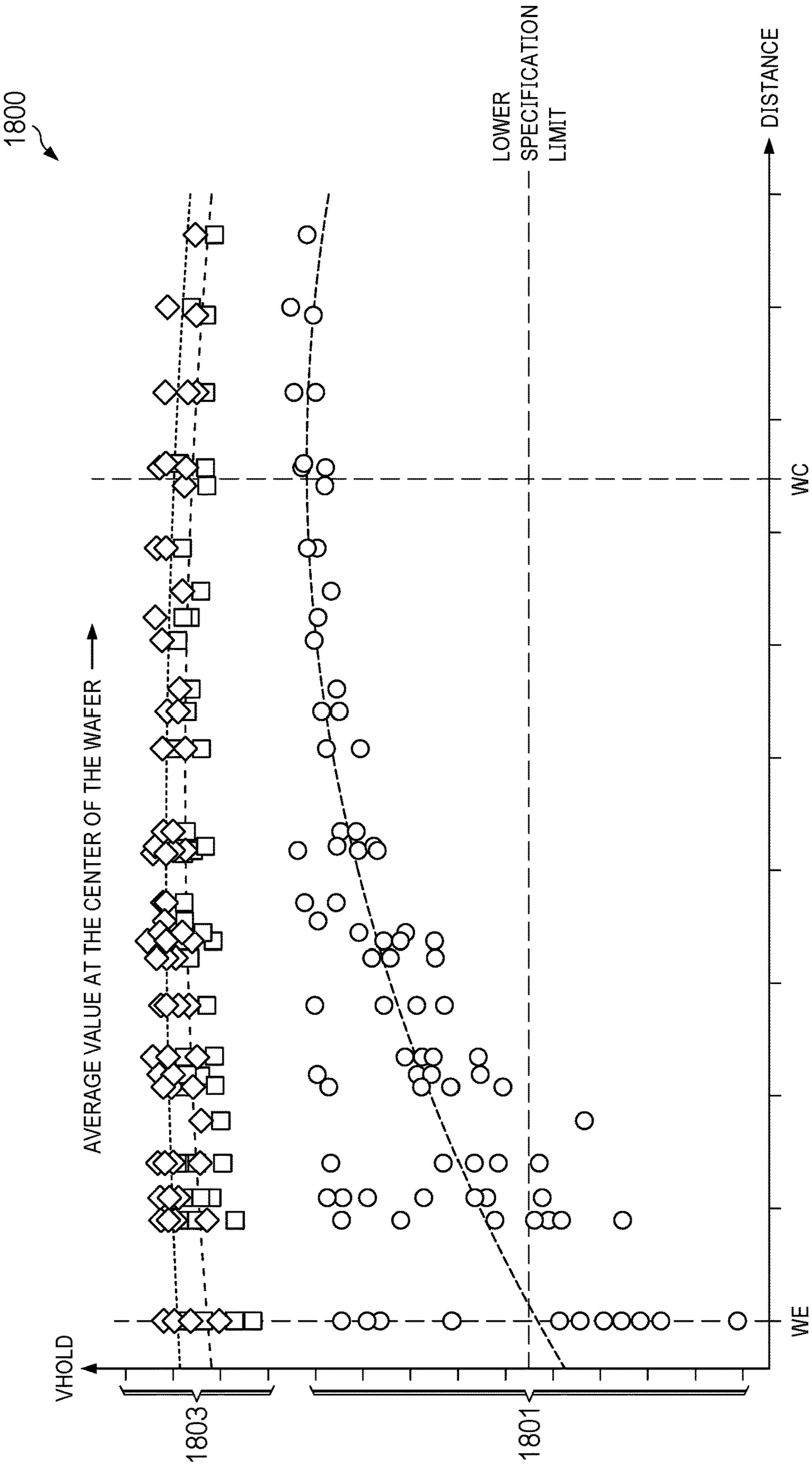
FIG. 18 is a graph of bipolar hold voltage as a function of distance.

FIG. 18 is a graph of bipolar hold voltage as a function of distance. Namely, FIG. 18 shows a graph 1800 with the vertical axis representing the bipolar hold voltage, e.g., VHOLD described with reference to FIG. 17, which is set below the breakdown voltage rating VB of a given device design. The horizontal axis in the graph 1800 represents the distance from the wafer edge ("WE") to the wafer center ("WC"). The graph 1800 includes a first set of data points 1801 corresponding to a baseline ESD protection circuit having no intrinsic epitaxial layer, and a second set of data points 1803 corresponding to the above described ESD protection circuit 111 in the semiconductor die 110 of the electronic device 100. As shown in the first data set 1801, certain electronic devices, for example, devices closer to the lateral edges of the processed wafer, suffer from hold voltages VHOLD (and hence breakdown voltage ratings) that fall below a final test lower specification limit (e.g., labeled "LOWER SPEC LIMIT"), whereas the data set 1803 from the devices that include the intrinsic epitaxial layer 114, all the devices have bipolar hold voltages VHOLD (and hence breakdown voltage ratings VB) that are above the lower specification limit. Consequently, the use of the intrinsic epitaxial layer 1400 in the ESD protection circuitry significantly improves fabrication product yield with respect to breakdown voltage final testing.

Figure 19:
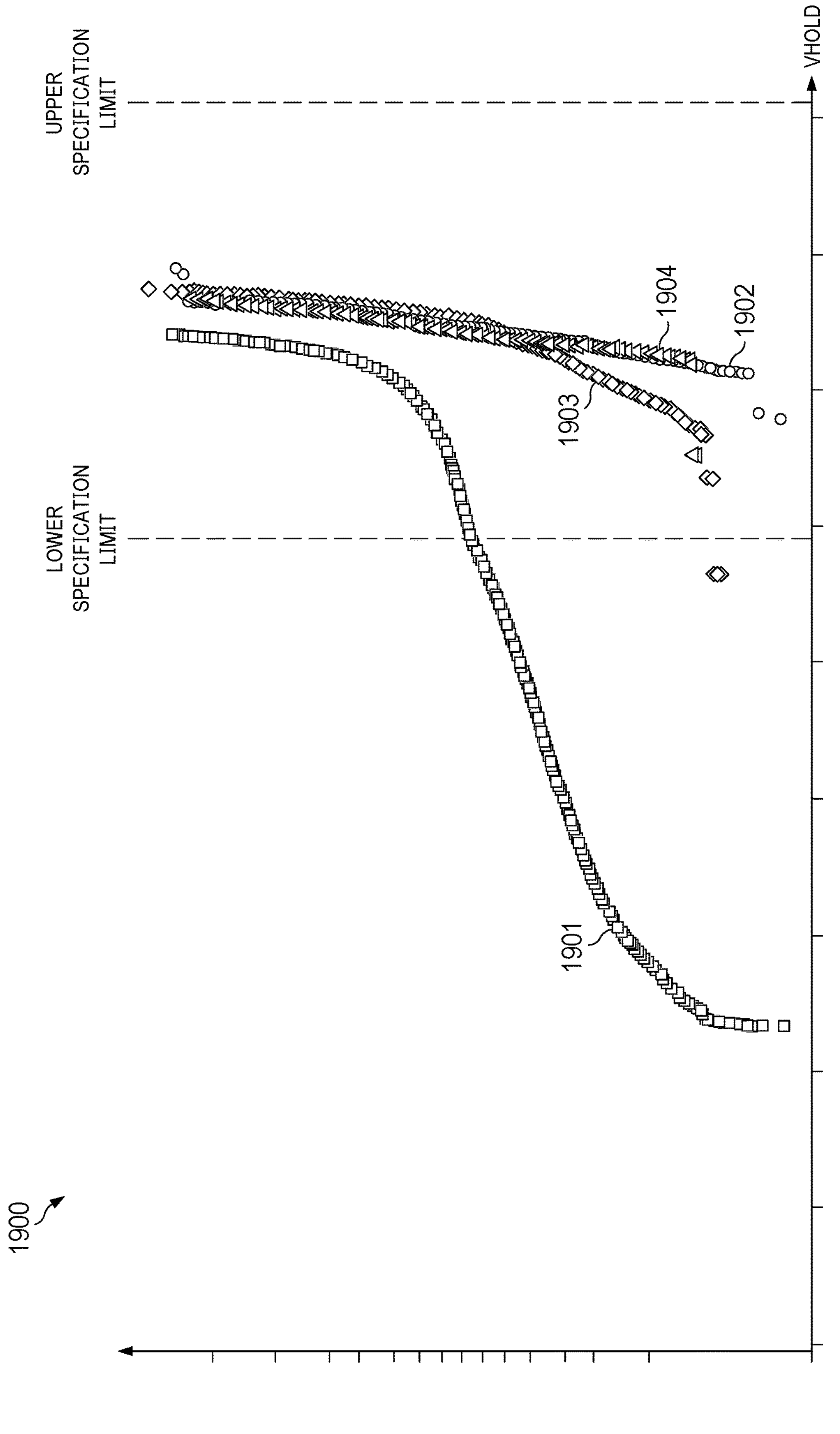
FIG. 19 shows cumulative probability plots of bipolar hold voltage.

FIG. 19 shows cumulative probability plots of bipolar hold voltage. Namely, FIG. 19 shows a graph 1900 including four cumulative probability plots of bipolar hold voltage, e.g., VHOLD described with reference to FIG. 17. The first curve 1901 corresponds to a baseline ESD protection circuit without an intrinsic epitaxial layer at a processed wafer edge. The second curve 1902 corresponds to the baseline ESD protection circuit without an intrinsic epitaxial layer at a processed wafer center. The third curve 1903 corresponds to an implementation of the ESD protection circuit 111 with an intrinsic epitaxial layer 114 at a processed wafer edge. The fourth curve 1904 corresponds to the implementation of the ESD protection circuit 111 with the intrinsic epitaxial layer 114 at a processed wafer center. As shown in the graph 1900, the baseline ESD protection device (e.g., curve 1902) and the example ESD protection circuit 111 with the intrinsic epitaxial layer 114 formed at the center of the processed wafer (e.g., curve 1904) fall within the acceptable breakdown voltage design range for VHOLD between the lower specification limit and the upper specification limit. As further shown in comparing the wafer edge curves 1901 and 1903 for the respective baseline and ESD protection circuit 111 with the intrinsic epitaxial layer 114, the baseline ESD protection devices at the processed wafer edge suffers from significant failure of the lower specification limit with respect to breakdown voltage operation (e.g., VHOLD), whereas the ESD protection circuit 111 with the intrinsic epitaxial layer 114 at the wafer edge provide significant improvement with performance generally between the acceptable breakdown voltage range for the bipolar hold voltage VHOLD between the lower specification limit and the upper specification limit.

Modifications are possible in the described examples, and other implementations are possible, within the scope of the claims.

What is claimed is:

1. An electronic device, comprising:

an n-type substrate having a first concentration of n-type dopants;

an intrinsic epitaxial layer on the n-type substrate having a second concentration of n-type dopants that is less than the first concentration of n-type dopants;

an n-type epitaxial layer on the intrinsic epitaxial layer having a third concentration of n-type dopants that is greater than the second concentration of n-type dopants; and a p-type epitaxial layer over the n-type epitaxial layer.

2. The electronic device of claim 1, wherein the intrinsic epitaxial layer has a thickness of 0.1 μm or more.

3. The electronic device of claim 2, wherein the thickness of the intrinsic epitaxial layer is 1.5 μm or less.

4. The electronic device of claim 1, further comprising an n-type region in a portion of the p-type epitaxial layer and spaced apart from the n-type epitaxial layer to form a cathode of a first diode.

5. The electronic device of claim 4, further comprising a p-type region in a portion of the n-type epitaxial layer and spaced apart from the n-type substrate.

6. The electronic device of claim 1, further comprising a p-type region in a portion of the p-type epitaxial layer and spaced apart from the n-type epitaxial layer.

7. The electronic device of claim 1, further comprising:

a first stack that includes a first portion of the n-type substrate, a first portion of the intrinsic epitaxial layer on the first portion of the n-type substrate, a first portion of the n-type epitaxial layer on the first portion of the intrinsic epitaxial layer, a first portion of the p-type epitaxial layer over the first portion of the n-type epitaxial layer, an n-type region in a portion of the first portion of the p-type epitaxial layer and spaced apart from the first portion of the n-type epitaxial layer to form a cathode of a first diode, and a p-type region in a portion of the n-type epitaxial layer and spaced apart from the n-type substrate, an interface between the p-type region in the portion of the n-type epitaxial layer and a portion of the n-type epitaxial layer forming a p-n junction of a Zener diode; and a second stack that is spaced apart from the first stack and includes a second portion of the n-type substrate, a second portion of the intrinsic epitaxial layer on the second portion of the n-type substrate, a second portion of the n-type epitaxial layer on the second portion of the intrinsic epitaxial layer, a second portion of the p-type epitaxial layer on the second portion of the n-type epitaxial layer, and a p-type region in the second portion of the p-type epitaxial layer and spaced apart from the second portion of the n-type epitaxial layer, an interface between the second portion of the p-type epitaxial layer and the second portion of the n-type epitaxial layer forming a p-n junction of a second diode.

8. The electronic device of claim 7, further comprising a deep trench isolation structure that extends through the intrinsic epitaxial layer, the n-type epitaxial layer, and the p-type epitaxial layer and into the n-type substrate and separates the first and second stacks.

9. The electronic device of claim 7, further comprising a metallization stricture that couples the cathode of a first diode to an anode of the second diode to form an electrostatic discharge (ESD) protection circuit.

10. The electronic device of claim 1, wherein:

the intrinsic epitaxial layer has a first thickness; and the n-type epitaxial layer has a second thickness that is greater than the first thickness.

11. An electronic device, comprising:

a protected circuit coupled to a terminal; and an electrostatic discharge protection circuit coupled to the terminal and including:

a first stack that includes a first portion of an n-type substrate, a first portion of an intrinsic epitaxial layer on the first portion of the n-type substrate, a first portion of an n-type epitaxial layer on the first portion of the intrinsic epitaxial layer, a first portion of a p-type epitaxial layer over the first portion of the n-type epitaxial layer, an n-type region in a portion of the first portion of the p-type epitaxial layer and spaced apart from the first portion of the n-type epitaxial layer to form a cathode of a first diode, and a p-type region in a portion of the n-type epitaxial layer and spaced apart from the n-type substrate, an interface between the p-type region in the portion of the n-type epitaxial layer and a portion of the n-type epitaxial layer forming a p-n junction of a Zener diode; and a second stack that is spaced apart from the first stack and includes a second portion of the n-type substrate, a second portion of the intrinsic epitaxial layer on the second portion of the n-type substrate, a second portion of the n-type epitaxial layer on the second portion of the intrinsic epitaxial layer, a second portion of the p-type epitaxial layer on the second portion of the n-type epitaxial layer, and a p-type region in the second portion of the p-type epitaxial layer and spaced apart from the second portion of the n-type epitaxial layer, an interface between the second portion of the p-type epitaxial layer and the second portion of the n-type epitaxial layer forming a p-n junction of a second diode.

12. The electronic device of claim 11, wherein:

the n-type substrate has a first concentration of n-type dopants;

the intrinsic epitaxial layer has a second concentration of n-type dopants that is less than the first concentration of n-type dopants; and the n-type epitaxial layer has a third concentration of n-type dopants that is greater than the second concentration of n-type dopants.

13. The electronic device of claim 11, further comprising a deep trench isolation structure that extends through the intrinsic epitaxial layer, the n-type epitaxial layer, and the p-type epitaxial layer and into the n-type substrate and separates the first and second stacks.

14. The electronic device of claim 11, further comprising a metallization stricture that couples the cathode of a first diode to an anode of the second diode and to the terminal.

* * * * *